(12) United States Patent
Nosaka

(10) Patent No.: US 10,630,261 B2
(45) Date of Patent: *Apr. 21, 2020

(54) ACOUSTIC WAVE FILTER DEVICE, RADIO-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Koji Nosaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/283,865

(22) Filed: Feb. 25, 2019

(65) Prior Publication Data

US 2019/0190496 A1    Jun. 20, 2019

Related U.S. Application Data

(63) Continuation of application No. PCT/JP2017/031271, filed on Aug. 30, 2017.

(30) Foreign Application Priority Data

Sep. 2, 2016   (JP) .................................. 2016-172272

(51) Int. Cl.
*H03H 9/64* (2006.01)
*H03H 9/60* (2006.01)
(Continued)

(52) U.S. Cl.
CPC ............ *H03H 9/6489* (2013.01); *H01Q 1/50* (2013.01); *H03H 9/02637* (2013.01);
(Continued)

(58) Field of Classification Search
CPC .. H03H 9/14582; H03H 9/725; H03H 9/6483; H03H 9/6436; H03H 9/14588;
(Continued)

(56) References Cited

U.S. PATENT DOCUMENTS

2009/0201104 A1    8/2009  Ueda et al.
2013/0113576 A1*   5/2013  Inoue .................... H03H 9/6433
                                                          333/133
(Continued)

FOREIGN PATENT DOCUMENTS

JP    2006-013576 A    1/2006
JP    2009-207116 A    9/2009
(Continued)

OTHER PUBLICATIONS

Official Communication issued in International Patent Application No. PCT/JP2017/031271, dated Oct. 31, 2017.

*Primary Examiner* — Ajibola A Akinyemi
(74) *Attorney, Agent, or Firm* — Keating & Bennett, LLP

(57) ABSTRACT

A filter includes a series-arm resonator connected on a path connecting an input/output terminal and an input/output terminal, and first and second parallel-arm resonators connected between the same node on the path and ground. A resonant frequency of the first parallel-arm resonator is lower than a resonant frequency of the second parallel-arm resonator, and an anti-resonant frequency of the first parallel-arm resonator is lower than an anti-resonant frequency of the second parallel-arm resonator. The first parallel-arm resonator is defined by an acoustic wave resonator, and includes an IDT electrode that excites an acoustic wave, and a reflector that reflects the acoustic wave excited by the IDT electrode. A pitch between the IDT electrode and the reflector is about 0.42λ or more and less than about 0.50λ.

20 Claims, 12 Drawing Sheets

(51) Int. Cl.
*H04B 1/00* (2006.01)
*H03H 9/54* (2006.01)
*H03H 9/145* (2006.01)
*H01Q 1/50* (2006.01)
*H03H 9/02* (2006.01)
*H04B 1/40* (2015.01)

(52) U.S. Cl.
CPC .... *H03H 9/14541* (2013.01); *H03H 9/14544* (2013.01); *H03H 9/542* (2013.01); *H03H 9/605* (2013.01); *H03H 9/6403* (2013.01); *H03H 9/6483* (2013.01); *H04B 1/006* (2013.01); *H04B 1/0057* (2013.01); *H04B 1/40* (2013.01)

(58) Field of Classification Search
CPC ...... H03H 9/0071; H03H 9/0038; H03H 9/64; H03H 9/0085; H03H 9/25; H03H 9/0057; H03H 9/0042; H03H 9/6433; H03H 9/02559; H03H 9/6469; H03H 9/0061; H03H 9/008; H03H 9/0222
USPC .......................................................... 455/73
See application file for complete search history.

(56) References Cited

U.S. PATENT DOCUMENTS

2017/0222624 A1    8/2017  Kishino
2019/0319601 A1*  10/2019  Takigawa ................. H03H 9/64

FOREIGN PATENT DOCUMENTS

JP    2014-068123 A    4/2014
WO   2016/017730 A1    2/2016

* cited by examiner

ACOUSTIC WAVE FILTER DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-172272 filed on Sep. 2, 2016 and is a Continuation Application of PCT Application No. PCT/JP2017/031271 filed on Aug. 30, 2017. The entire contents of each of these applications are hereby incorporated herein by reference.

BACKGROUND OF THE INVENTION

1. Field of the Invention

The present invention relates to an acoustic wave filter device including resonators, a radio-frequency front-end circuit, and a communication apparatus.

2. Description of the Related Art

An existing acoustic wave filter device, such as a ladder filter, is configured such that a single parallel arm (parallel-arm resonant circuit) connecting a series arm (series-arm resonant circuit) and ground is provided with a plurality of parallel-arm resonators (see, for example, Japanese Unexamined Patent Application Publication No. 2009-207116). In this configuration, a plurality of parallel-arm resonators having different resonant frequencies are disposed in a single parallel arm so as to be connected in series with each other, to achieve an improvement in the skirt characteristics (attenuation slopes) of a filter.

However, when the existing acoustic wave filter device described above is defined by resonators that use acoustic waves, a parallel-arm resonator having a low resonant frequency and a low anti-resonant frequency among a plurality of parallel-arm resonators disposed in the same parallel arm may generate ripples which result in an increase in loss within the pass band.

Specifically, a resonator that uses an acoustic wave is defined by an IDT (InterDigital Transducer) electrode and reflectors having a periodic structure including a periodic array of conductive strips (electrode fingers). With this configuration, such a resonator has a frequency band over which acoustic waves in a specific frequency region are reflected with high reflection coefficients. Such a frequency band is generally referred to as a stop band and is defined by the repetition period of the periodic structure. At this time, ripples that are local fluctuations in reflection coefficient are likely to occur at the high-frequency end of the stop band.

In the existing acoustic wave filter device described above, the high-frequency end of the stop band of a low-frequency parallel-arm resonator may be located in the pass band or near the high-frequency end of the pass band. In this case, therefore, ripples occurring at the high-frequency end of the stop band of this parallel-arm resonator may increase the loss within the pass band.

SUMMARY OF THE INVENTION

Preferred embodiments of the present invention provide acoustic wave filter devices, radio-frequency front-end circuits, and communication apparatuses that are each able to reduce or prevent the loss within the pass band.

An acoustic wave filter device according to a preferred embodiment of the present invention includes a series-arm resonant circuit including one or more acoustic wave resonators that are connected between a first input/output terminal and a second input/output terminal, and a first parallel-arm resonator and a second parallel-arm resonator that are connected between the same node on a path connecting the first input/output terminal and the second input/output terminal and ground. A resonant frequency of the first parallel-arm resonator is lower than a resonant frequency of the second parallel-arm resonator, and an anti-resonant frequency of the first parallel-arm resonator is lower than an anti-resonant frequency of the second parallel-arm resonator. The first parallel-arm resonator includes an IDT electrode that excites an acoustic wave, and a reflector that reflects the acoustic wave excited by the IDT electrode. When a wave length of an acoustic wave that is defined by an electrode period of the IDT electrode is denoted by $\lambda$, a pitch between the IDT electrode and the reflector is about $0.42\lambda$ or more and less than about $0.50\lambda$.

That is, as a result of intensive research, the inventor of preferred embodiments of the present invention has discovered that setting the I-R pitch of the first parallel-arm resonator to about $0.42\lambda$ or more and less than about $0.50\lambda$ reduces the loss within the pass band. Specifically, if the I-R pitch is excessively large, ripples at the high-frequency end of the stop band of the first parallel-arm resonator are large, resulting in an increase in loss within the pass band. If the I-R pitch is excessively small, on the other hand, ripples in a frequency range higher than the resonant frequency (specifically, between the resonant frequency and the anti-resonant frequency) of the first parallel-arm resonator are large, resulting in an increase in loss within the pass band or deterioration of the attenuation characteristic on the low-frequency side of the pass band. Thus, setting the I-R pitch of the first parallel-arm resonator to fall within a suitable range reduces the loss within the pass band.

Further, in the first parallel-arm resonator, the pitch between the IDT electrode and the reflector may be about $0.44\lambda$ or more and about $0.46\lambda$ or less.

That is, as a result of intensive research, the inventor of preferred embodiments of the present invention has discovered that setting the I-R pitch of the first parallel-arm resonator to about $0.44\lambda$ or more and about $0.46\lambda$ or less more reliably reduces or prevents the increase in loss within the pass band and reduces or prevents the deterioration of the attenuation characteristic on the low-frequency side of the pass band. Specifically, increasing the I-R pitch close to about $0.50\lambda$ reduces ripples in a frequency range higher than the resonant frequency of the first parallel-arm resonator. However, it is difficult to reduce ripples at the high-frequency end of the stop band of the first parallel-arm resonator. In contrast, reducing the I-R pitch close to about 0.42 reduces ripples at the high-frequency end of the stop band of the first parallel-arm resonator. However, it is difficult to reduce ripples in a frequency range higher than the resonant frequency of the first parallel-arm resonator. Therefore, setting the I-R pitch of the first parallel-arm resonator to about $0.44\lambda$ or more and about $0.46\lambda$ or less reduces both ripples at the high-frequency end of the stop band of the first parallel-arm resonator and ripples in a frequency range higher than the resonant frequency of the first parallel-arm resonator. Thus, the loss within the pass band is able to be more reliably reduced.

An acoustic wave filter device according to a preferred embodiment of the present invention may further include an impedance circuit in which an impedance element and a switch element are connected in parallel. At least one of the first parallel-arm resonator and the second parallel-arm resonator may be connected in series with the impedance circuit.

Accordingly, it is possible to provide a tunable filter that switches between a first characteristic and a second characteristic in accordance with the connection or disconnection of the switch element.

Further, the second parallel-arm resonator may be connected in series with the impedance circuit, and the first parallel-arm resonator may be connected in parallel to a circuit in which the second parallel-arm resonator and the impedance circuit are connected in series.

Accordingly, it is possible to provide a tunable filter that switches between a first characteristic and a second characteristic with a reduced or prevented increase in insertion loss at the high-frequency end of the pass band while switching the attenuation pole frequency on the high-frequency side of the pass band in accordance with switching between the connection and disconnection of the switch element.

Alternatively, the first parallel-arm resonator may be connected in series with the impedance circuit, and the second parallel-arm resonator may be connected in parallel to a circuit in which the first parallel-arm resonator and the impedance circuit are connected in series.

Accordingly, it is possible to provide a tunable filter that switches between a first characteristic and a second characteristic with a reduced or prevented increase in insertion loss at the low-frequency end of the pass band while switching the attenuation pole frequency on the low-frequency side of the pass band in accordance with switching between the connection and disconnection of the switch element.

Alternatively, the first parallel-arm resonator and the second parallel-arm resonator may be connected in parallel, and the impedance circuit may be connected in series with a circuit in which the first parallel-arm resonator and the second parallel-arm resonator are connected in parallel.

Accordingly, it is possible to provide a tunable filter that is capable of switching both pole (attenuation pole) frequencies on both sides of the pass band in accordance with switching between the connection and disconnection of the switch element.

An acoustic wave filter device according to a preferred embodiment of the present invention may further include two impedance circuits, each impedance circuit including an impedance element and a switch element that are connected in parallel. The first parallel-arm resonator may be connected in series with one impedance circuit among the two impedance circuits, the second parallel-arm resonator may be connected in series with another impedance circuit among the two impedance circuits, and a circuit in which the first parallel-arm resonator and the one impedance circuit are connected in series and a circuit in which the second parallel-arm resonator and the other impedance circuit are connected in series may be connected in parallel.

Accordingly, it is possible to provide a tunable filter that is capable of switching the attenuation pole frequencies on the high-frequency side of the pass band and the low-frequency side of the pass band in accordance with switching between the connection and disconnection of the switch element and that is capable of reducing or preventing the increase in insertion loss at the high-frequency end of the pass band and at the low-frequency end of the pass band. Thus, such a tunable filter is able to, for example, switch the center frequency while maintaining the band width.

An acoustic wave filter device according to a preferred embodiment of the present invention may further include a switch element connected in parallel to one parallel-arm resonator among the first parallel-arm resonator and the second parallel-arm resonator, and another parallel-arm resonator among the first parallel-arm resonator and the second parallel-arm resonator may be connected in series with a circuit in which the one parallel-arm resonator and the switch element are connected in parallel.

Accordingly, it is possible to provide a tunable filter that is capable of switching the attenuation pole frequency on the low-frequency side of the pass band in accordance with switching between the connection and disconnection of the switch element and that is capable of switching the number of attenuation poles on the high-frequency side of the pass band.

A radio-frequency front-end circuit according to a preferred embodiment of the present invention includes an acoustic wave filter device according to a preferred embodiment of the present invention, and an amplifier circuit connected to the acoustic wave filter device.

Accordingly, it is possible to provide a radio-frequency front-end circuit that is able to reduce or prevent the loss within the pass band.

A communication apparatus according to a preferred embodiment of the present invention includes an RF signal processing circuit that processes a radio-frequency signal transmitted or received by an antenna element, and a radio-frequency front-end circuit according to a preferred embodiment of the present invention that transmits the radio-frequency signal between the antenna element and the RF signal processing circuit.

Accordingly, it is possible to provide a communication apparatus that is able to reduce or prevent the loss within the pass band.

Acoustic wave filter devices, radio-frequency front-end circuits, and communication apparatuses according to preferred embodiments of the present invention are each able to reduce or prevent the loss within the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
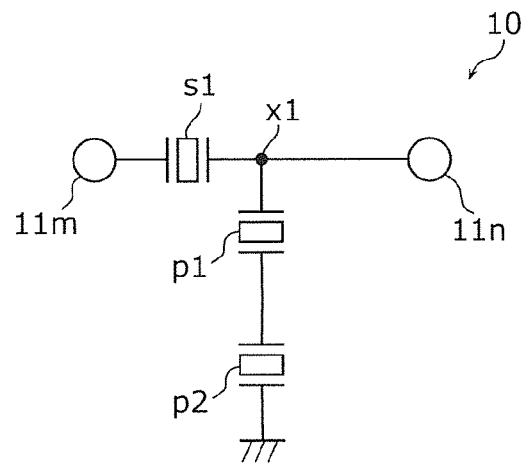
FIG. 1A is a circuit configuration diagram of a filter according to a Preferred Embodiment 1 of the present invention.

The following describes preferred embodiments of the present invention in detail with reference to Examples and the accompanying drawings. All of the preferred embodiments described below provide general or specific examples. The values, shapes, materials, elements, the arrangements and connection structures of the elements, which are provided in the following preferred embodiments, are examples and are not intended to limit the present invention. The elements mentioned in the following preferred embodiments are described as optional elements unless they are specified in the independent claims. In addition, the elements illustrated in the drawings are not representative of exact proportions or dimensions. Additionally, in the drawings, the same or substantially the same elements are denoted by the same reference numerals, and any redundant description will be omitted or may be briefly provided.

In the following, "the low-frequency end of a pass band" refers to "the lowest frequency in a pass band". Further, "the high-frequency end of a pass band" refers to "the highest frequency in a pass band". In the following, furthermore, "the low-frequency side of a pass band" refers to "frequencies outside a pass band and lower than the pass band". Further, "the high-frequency side of a pass band" refers to "frequencies outside a pass band and higher than the pass band".

Preferred Embodiment 1

FIG. 1A is a circuit configuration diagram of a filter 10 according to a Preferred Embodiment 1 of the present invention.

The filter 10 is preferably a radio frequency filter circuit provided in a front-end portion of a multi-mode/multi-band cellular phone, for example. The filter 10 is preferably, for example, a band pass filter included in a multi-band cellular phone complying with a communication standard, such as LTE (Long Term Evolution), and configured to filter radio-frequency signals in a predetermined band. The filter 10 is preferably, for example, an acoustic wave filter device that filters radio-frequency signals using acoustic wave resonators.

As illustrated in FIG. 1A, the filter 10 includes a series-arm resonator s1 and parallel-arm resonators p1 and p2.

The series-arm resonator s1 is connected between an input/output terminal 11m (first input/output terminal) and an input/output terminal 11n (second input/output terminal). That is, the series-arm resonator s1 is a series-arm resonant circuit disposed in a path connecting the input/output terminal 11m and the input/output terminal 11n. The path may be provided with, instead of the series-arm resonator s1, a series-arm resonant circuit including one or more acoustic wave resonators. In the present preferred embodiment, the series-arm resonant circuit includes a single acoustic wave resonator. However, the series-arm resonant circuit may include a plurality of acoustic wave resonators. A series-arm resonant circuit including a plurality of acoustic wave resonators preferably includes, for example, a longitudinally coupled resonator including a plurality of acoustic wave resonators, or a plurality of sub-resonators into which, for example, a single acoustic wave resonator is divided in series. For example, a longitudinally coupled resonator used as a series-arm resonant circuit is able to satisfy required filter characteristics, such as attenuation enhancement.

The parallel-arm resonator p1 is a first parallel-arm resonator connected to a node (in FIG. 1A, a node x1) on the path connecting the input/output terminal 11m and the input/output terminal 11n and to ground (reference terminal). That is, the parallel-arm resonator p1 is a resonator disposed in a parallel-arm resonant circuit connecting the node x1 on the path and ground.

The parallel-arm resonator p2 is a second parallel-arm resonator connected to the node (in FIG. 1A, the node x1) on the path connecting the input/output terminal 11m and the input/output terminal 11n and to ground (reference terminal). That is, the parallel-arm resonator p2 is a resonator disposed in the parallel-arm resonant circuit connecting the node x1 on the path and ground.

The parallel-arm resonator p1 has a resonant frequency lower than the resonant frequency of the parallel-arm resonator p2, and the parallel-arm resonator p1 has an anti-resonant frequency lower than the anti-resonant frequency of the parallel-arm resonator p2. The resonant frequency of a resonator is the frequency of a "resonant point", which is a singularity at which the impedance of the resonator reaches a local minimum (ideally, a point at which the impedance reaches 0). Further, the anti-resonant frequency of a resonator is the frequency of an "anti-resonant point", which is a singularity at which the impedance of the resonator reaches a local maximum (ideally, a point at which the impedance becomes infinite).

In the present preferred embodiment, the parallel-arm resonators p1 and p2 are connected in series and between the node x1 and ground. In the present preferred embodiment, the parallel-arm resonator p1 includes a terminal connected to the node x1 and another terminal connected to one terminal of the parallel-arm resonator p2. The parallel-arm resonator p2 includes a terminal connected to the other terminal of the parallel-arm resonator p1 and another terminal connected to ground. The order in which the parallel-arm resonators p1 and p2 are connected is not limited to that described above and may be reverse. In the present preferred embodiment, furthermore, the parallel-arm resonators p1 and p2 are each defined by a single acoustic wave resonator. However, at least one of the parallel-arm resonators p1 and p2 may be defined by a plurality of sub-resonators into which a single acoustic wave resonator is divided in series or in parallel.

Further, the parallel-arm resonators p1 and p2 define a parallel-arm resonant circuit connected between ground and the node x1 on the path connecting the input/output terminal 11m and the input/output terminal 11n. That is, the parallel-arm resonant circuit is disposed in a single path connecting the path and ground. Thus, the filter 10 has a single-stage ladder filter structure defined by the series-arm resonator s1 and a parallel-arm resonant circuit (in the present preferred embodiment, the parallel-arm resonators p1 and p2).

That is, the parallel-arm resonant circuit defined by the parallel-arm resonators p1 and p2, and the series-arm resonator s1 provide the pass band of the filter 10.

Next, the structure of the filter 10 will be described.

Figure 1B:
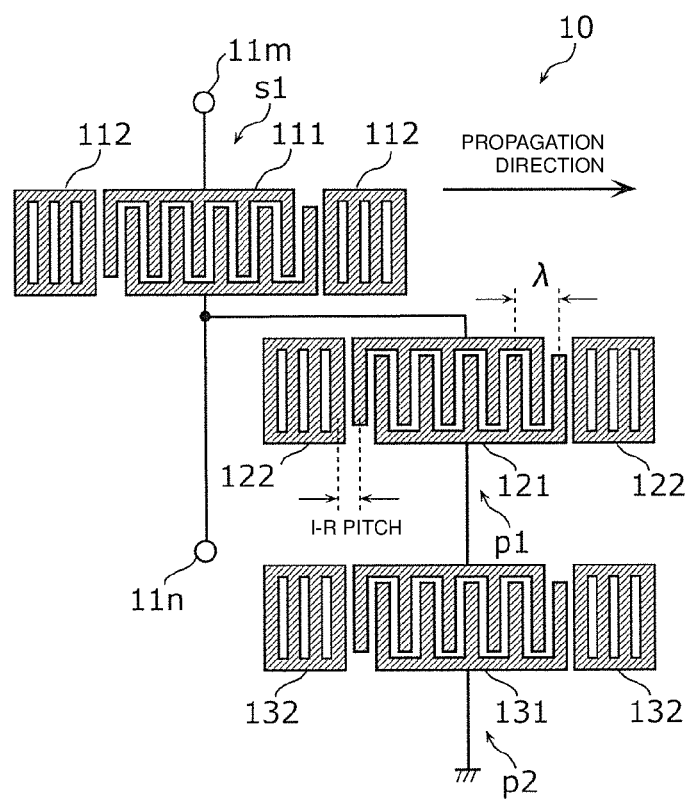
FIG. 1B is a schematic plan view of an electrode structure of the filter according to the Preferred Embodiment 1 of the present invention.

FIG. 1B is a schematic plan view of an electrode structure of the filter 10 according to the Preferred Embodiment 1.

As illustrated in FIG. 1B, the resonators included in the filter 10 (the series-arm resonator s1 and the parallel-arm resonators p1 and p2) are each preferably an acoustic wave resonator that uses an acoustic wave, for example. Accordingly, the filter 10 is able to be defined by IDT electrodes on a substrate with piezoelectric properties, and thus a compact, low-profile filter circuit having a bandpass characteristic with improved steepness is able to be obtained. The substrate with piezoelectric properties is a substrate, at least a surface of which has piezoelectric properties. The substrate may preferably be, for example, a multilayer body including a piezoelectric thin film on a surface thereof and a film having a different acoustic velocity from the piezoelectric thin film, a support substrate, and other suitable films. Alternatively, the substrate may be, for example, a multilayer body including a high-acoustic-velocity support substrate and a piezoelectric thin film disposed on the high-acoustic-velocity support substrate, a multilayer body including a high-acoustic-velocity support substrate, a low-acoustic-velocity film disposed on the high-acoustic-velocity support substrate, and a piezoelectric thin film disposed on the low-acoustic-velocity film, or a multilayer body including a support substrate, a high-acoustic-velocity film disposed on the support substrate, a low-acoustic-velocity film disposed on the high-acoustic-velocity film, and a piezoelectric thin film disposed on the low-acoustic-velocity film. The entire substrate may have piezoelectric properties.

Each of the series-arm resonator s1 and the parallel-arm resonator p1 includes an IDT electrode that excites an acoustic wave, and a set of reflectors disposed on both sides of the IDT electrode in the acoustic wave propagation direction. Specifically, the series-arm resonator s1 includes an IDT electrode 111 and a set of reflectors 112. The parallel-arm resonator p1 includes an IDT electrode 121 and a set of reflectors 122. The parallel-arm resonator p2 includes an IDT electrode 131 and a set of reflectors 132.

The parallel-arm resonator p1 (first parallel-arm resonator) includes the IDT electrode 121 that excites an acoustic wave having a longer wave length than the IDT electrode 131 of the parallel-arm resonator p2 (second parallel-arm resonator), and the reflectors 122 that reflect the acoustic wave excited by the IDT electrode 121.

In the parallel-arm resonator p1, when the wave length of the acoustic wave (i.e., twice as large as the electrode pitch), which is defined by the electrode pitch (electrode period) of the IDT electrode 121, is denoted by $\lambda$, the pitch between the IDT electrode 121 and the reflectors 122 (i.e., IDT-Ref. pitch, hereinafter referred to as "I-R pitch") is preferably about $0.42\lambda$ or more and less than about $0.50\lambda$, and more preferably about $0.44\lambda$ or more and about $0.46\lambda$ or less, for example. This will be described below.

The following describes the structure of each of the resonators included in the filter 10 in more detail, focusing on the parallel-arm resonator p1. The other resonators have the same or substantially the same structure as the parallel-arm resonator p1, except that, for example, the I-R pitch is preferably about 0.5 times as large as the wave length $\lambda$ of the acoustic wave, and will not be described in detail herein.

Figure 2:
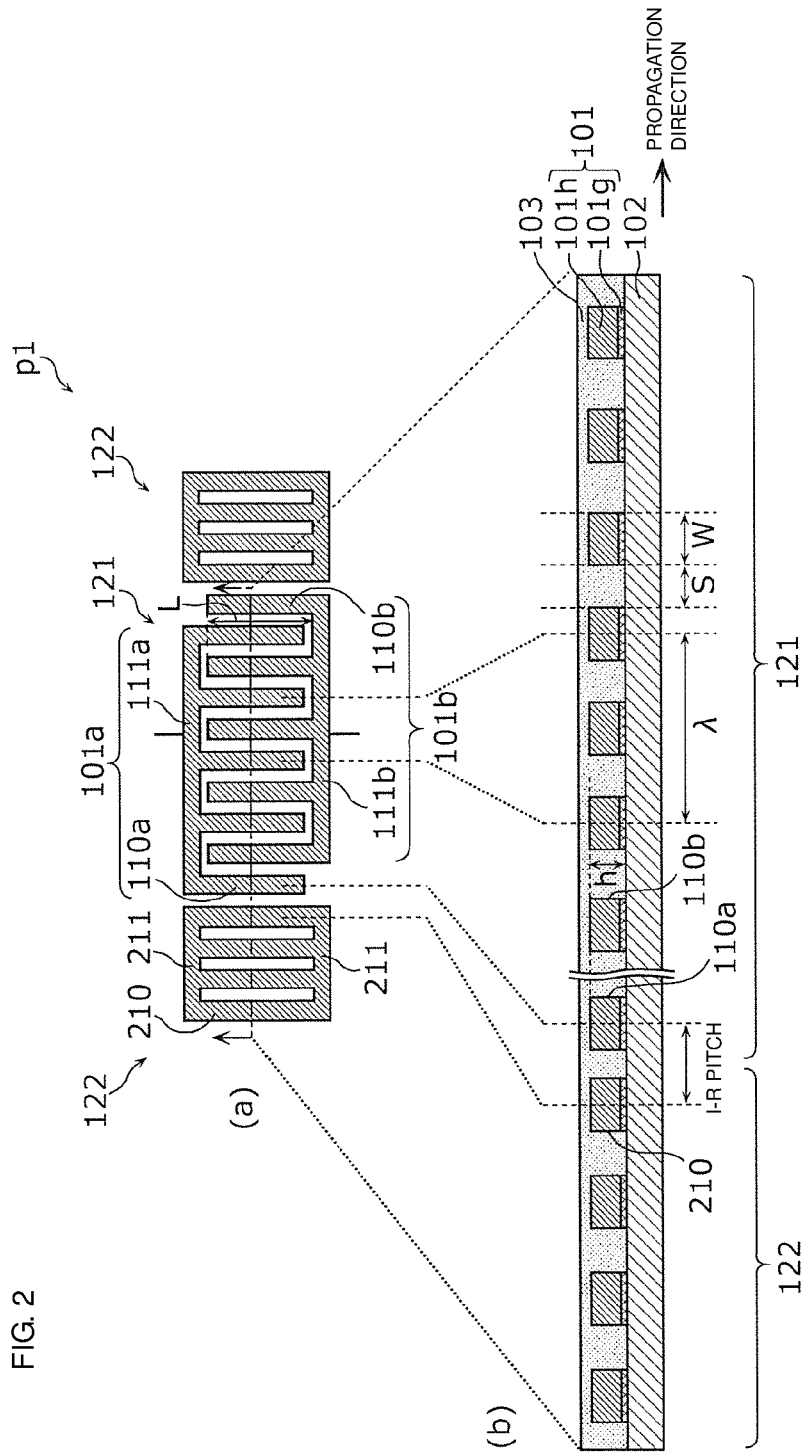
FIG. 2 is an example schematic diagram of the structure of a parallel-arm resonator in the Preferred Embodiment 1 of the present invention.

FIG. 2 is an example schematic diagram of the structure of the parallel-arm resonator p1 in the present preferred embodiment, in which portion (a) is a plan view of the parallel-arm resonator p1, and portion (b) is a cross-sectional view of the parallel-arm resonator p1 illustrated in portion (a). The parallel-arm resonator p1 illustrated in FIG. 2 is to illustrate a typical structure of the resonators included in the filter 10. For this reason, the number, length, and other parameters of electrode fingers of an IDT electrode of each resonator in the filter 10 are not limited to the number and length of electrode fingers of an IDT electrode illustrated in FIG. 2.

As illustrated in portions (a) and (b) of FIG. 2, the parallel-arm resonator p1 includes an electrode film 101 that defines the IDT electrode 121 and the reflectors 122, a piezoelectric substrate 102 including the electrode film 101, and a protection layer 103 that covers the electrode film 101. These components will be described in detail hereinafter.

As illustrated in portion (a) of FIG. 2, a pair of opposing comb electrodes 101a and 101b included in the IDT electrode 121 are disposed on the piezoelectric substrate 102. The comb electrode 101a includes a plurality of parallel electrode fingers 110a and a busbar electrode 111a that connects the plurality of electrode fingers 110a together. The comb electrode 101b includes a plurality of parallel electrode fingers 110b and a busbar electrode 111b that connects the plurality of electrode fingers 110b together. The pluralities of electrode fingers 110a and 110b extend in a direction perpendicular or substantially perpendicular to the acoustic wave propagation direction, and are periodically disposed in the propagation direction.

The IDT electrode 121 having the configuration described above excites a surface acoustic wave in a specific frequency region defined by the electrode pitch and other properties of the pluralities of electrode fingers 110a and 110b included in the IDT electrode 121.

The comb electrodes 101a and 101b are each sometimes referred to alone as IDT electrode. In the following description, however, the pair of comb electrodes 101a and 101b define a single IDT electrode 121, for convenience of description.

The reflectors 122 are disposed relative to the IDT electrode 121 in the acoustic wave propagation direction. Specifically, a set of reflectors 122 is disposed on both sides of the IDT electrode 121 in the acoustic wave propagation direction. The reflectors 122 each include a plurality of parallel electrode fingers 210 and a set of busbar electrodes 211. The set of busbar electrodes 211 includes a busbar electrode 211 that connects ends of the plurality of electrode fingers 210 together, and a busbar electrode 211 that connects the other ends of the plurality of electrode fingers 210 together. The plurality of electrode fingers 210 extend in a direction perpendicular or substantially perpendicular to the acoustic wave propagation direction in a the same or similar manner as that of the pluralities of electrode fingers 110a and 110b included in the IDT electrode 121, and are periodically disposed in the propagation direction.

The reflectors 122 having the configuration described above reflect a surface acoustic wave at a high reflection coefficient in a frequency band (stop band) defined by the electrode pitch and other parameters of the plurality of electrode fingers 210 of the reflectors 122. That is, when the electrode pitch of the IDT electrode 121 and the electrode pitch of the reflectors 122 are equal or substantially equal, the reflectors 122 reflect a surface acoustic wave excited by the IDT electrode 121 at a high reflection coefficient.

The reflectors 122 having the configuration described above enable the excited surface acoustic wave to be confined within the parallel-arm resonator p1 so that the surface acoustic wave is less likely to leak to the outside. Accordingly, the parallel-arm resonator p1 is able to improve the Qs at the resonant frequency and the anti-resonant frequency, which are defined by the electrode pitch, the number of pairs of electrode fingers, overlap width, and other parameters of the IDT electrode 121.

The reflectors 122 are only required to include the electrode fingers 210, and may not include the busbar electrodes 211. In addition, the number of electrode fingers 210 may be one or more, and is not limited specifically. However, if the number of electrode fingers 210 is excessively small, the acoustic wave leakage is large, which may result in the deterioration of filter characteristics. If the number of electrode fingers 210 is excessively large, in contrast, the size of the reflectors 122 is large, which may result in an increase in the overall size of the filter 10. Accordingly, the number of electrode fingers 210 may be determined, as desired, by taking into account the filter characteristics, size, and other factors required for the filter 10.

The IDT electrode 121 and the reflectors 122 are defined by the electrode film 101 illustrated in portion (b) of FIG. 2. In the present preferred embodiment, as illustrated in portion (b) of FIG. 2, the electrode film 101 preferably has, for example, a multilayer structure including a close contact layer 101g and a main electrode layer 101h. In the present preferred embodiment, the IDT electrode 121 and the reflectors 122 are defined by the same electrode film 101. Alternatively, the IDT electrode 121 and the reflectors 122 may be defined by electrode films having different structures, compositions, or other characteristics.

The close contact layer 101g is a layer that improves the contact between the piezoelectric substrate 102 and the main electrode layer 101h, and is preferably made of, for example, Ti. The close contact layer 101g preferably has a film thickness of, for example, about 12 nm.

The main electrode layer 101h is preferably made of, for example, Al including 1% of Cu. The main electrode layer 101h preferably has a film thickness of, for example, about 162 nm.

The piezoelectric substrate 102 includes the electrode film 101 (i.e., the IDT electrode 121 and the reflectors 122) provided and is preferably made of, for example, LiTaO₃ piezoelectric single crystal, LiNbO₃ piezoelectric single crystal, KNbO₃ piezoelectric single crystal, quartz, or piezoelectric ceramics.

The protection layer 103 covers the comb electrodes 101a and 101b. The protection layer 103 protects the main electrode layer 101h from the outside environment, adjusts the frequency temperature characteristics, and improves humidity resistance, and is a film preferably including, for example, silicon dioxide as a main component.

The structure of each of the resonators included in the filter 10 is not limited to the structure depicted in FIG. 2. For example, the electrode film 101 may be a single-layer metal film, rather than a multilayer structure of metal films. In addition, the materials of the close contact layer 101g, the main electrode layer 101h, and the protection layer 103 are not limited to those described above. Additionally, the electrode film 101 may be made of, for example, a metal such as Ti, Al, Cu, Pt, Au, Ag, or Pd, or an alloy, or may include a plurality of multilayer bodies made of the metal or alloy. Further, the protection layer 103 is optional.

In the parallel-arm resonator p1 having the configuration described above, the design parameters of the IDT electrode 121 define the wave length of the acoustic wave to be excited. The following describes the design parameters of the IDT electrode 121, that is, the design parameters of the comb electrode 101a and the comb electrode 101b.

The wave length of the acoustic wave is defined by a repetition period λ of the plurality of electrode fingers 110a or 110b of the comb electrodes 101a and 101b illustrated in FIG. 2. An electrode pitch (electrode period) is equal to about ½ of the repetition period λ and is defined by (W+S), where W denotes the line width of the electrode fingers 110a and 110b of the comb electrodes 101a and 101b, and S denotes the width of the space between one of the electrode fingers 110a and one of the electrode fingers 110b, which are adjacent to each other. Further, as illustrated in portion (a) of FIG. 2, an overlap width L of the IDT electrode 121 corresponds to the length of an overlap portion of the electrode fingers 110a of the comb electrode 101a and the electrode fingers 110b of the comb electrode 101b when viewed in the acoustic wave propagation direction. Further, an electrode duty (duty ratio) is the proportion of the line width of the pluralities of electrode fingers 110a and 110b, and corresponds to the ratio of the line width of the pluralities of electrode fingers 110a and 110b to the sum of the line width and the space width of the pluralities of electrode fingers 110a and 110b, which is defined by W/(W+S). Further, the number of pairs of electrode fingers refers to the number of paired electrode fingers 110a and 110b of the comb electrodes 101a and 101b, and is approximately half the total number of electrode fingers 110a and 110b. For example, when the number of pairs of electrode fingers is denoted by N and the total number of electrode fingers 110a and 110b is denoted by M, then M=2N+1 is satisfied. Further, the film thickness of the IDT electrode 121 refers to a thickness h of the pluralities of electrode fingers 110a and 110b.

Next, the design parameters of the reflectors 122 will be described.

The electrode pitch (electrode period) of the reflectors 122 is defined by ($W_{REF}+S_{REF}$), where $W_{REF}$ denotes the line width of the electrode fingers 210, and $S_{REF}$ denotes the width of the space between adjacent electrode fingers 210. Further, the electrode duty (duty ratio) of the reflectors 122 refers to the proportion of the line width of the plurality of electrode fingers 210, and corresponds to the ratio of the line width of the electrode fingers 210 to the sum of the line width and the space width of the electrode fingers 210, which is defined by $W_{REF}/(W_{REF}+S_{REF})$. Further, the film thickness of the reflectors 122 refers to the thickness of the plurality of electrode fingers 210.

In the present preferred embodiment, the electrode pitch and electrode duty of the reflectors 122 are preferably respectively equivalent to the electrode pitch and electrode duty of the IDT electrode 121. Further, the reflectors 122 are disposed such that the set of busbar electrodes 211 overlaps the busbar electrodes 111a and 111b of the IDT electrode 121 when viewed in the acoustic wave propagation direction.

In terms of reducing acoustic wave leakage, the reflectors 122 preferably have the configuration described above. Alternatively, the reflectors 122 may have a different configuration from that described above.

Next, design parameters related to the relative arrangement between the IDT electrode 121 and the reflectors 122 will be described.

The pitch (I-R pitch) between the IDT electrode 121 and the reflectors 122 is defined as the center-to-center distance between (i) the electrode finger closest to either of the reflectors 122 among the plurality of electrode fingers 110a or 110b included in the IDT electrode 121 and (ii) the electrode finger 210 closest to the IDT electrode 121 among the plurality of electrode fingers 210 of the reflector 122. The I-R pitch may be represented using the repetition period $\lambda$ of the plurality of electrode fingers 110a or 110b of the comb electrodes 101a and 101b (i.e., the wave length $\lambda$ of the acoustic wave, which is determined by the electrode pitch of the IDT electrode 121). For example, an I-R pitch that is about 0.50 times as large as the repetition period $\lambda$ is represented as about $0.50\lambda$.

Next, filter characteristics of the filter 10 according to the present preferred embodiment will be described.

In the following, for convenience of description, for not only a resonator alone but also a circuit including a plurality of resonators, a singularity at which the impedance reaches a local minimum (ideally, a point at which the impedance reaches 0) is referred to as "resonant point", and the frequency at this point is referred to as "resonant frequency". Further, a singularity at which the impedance reaches a local maximum (ideally, a point at which the impedance becomes infinite) is referred to as "anti-resonant point", and the frequency at this point is referred to as "anti-resonant frequency".

Figure 3:
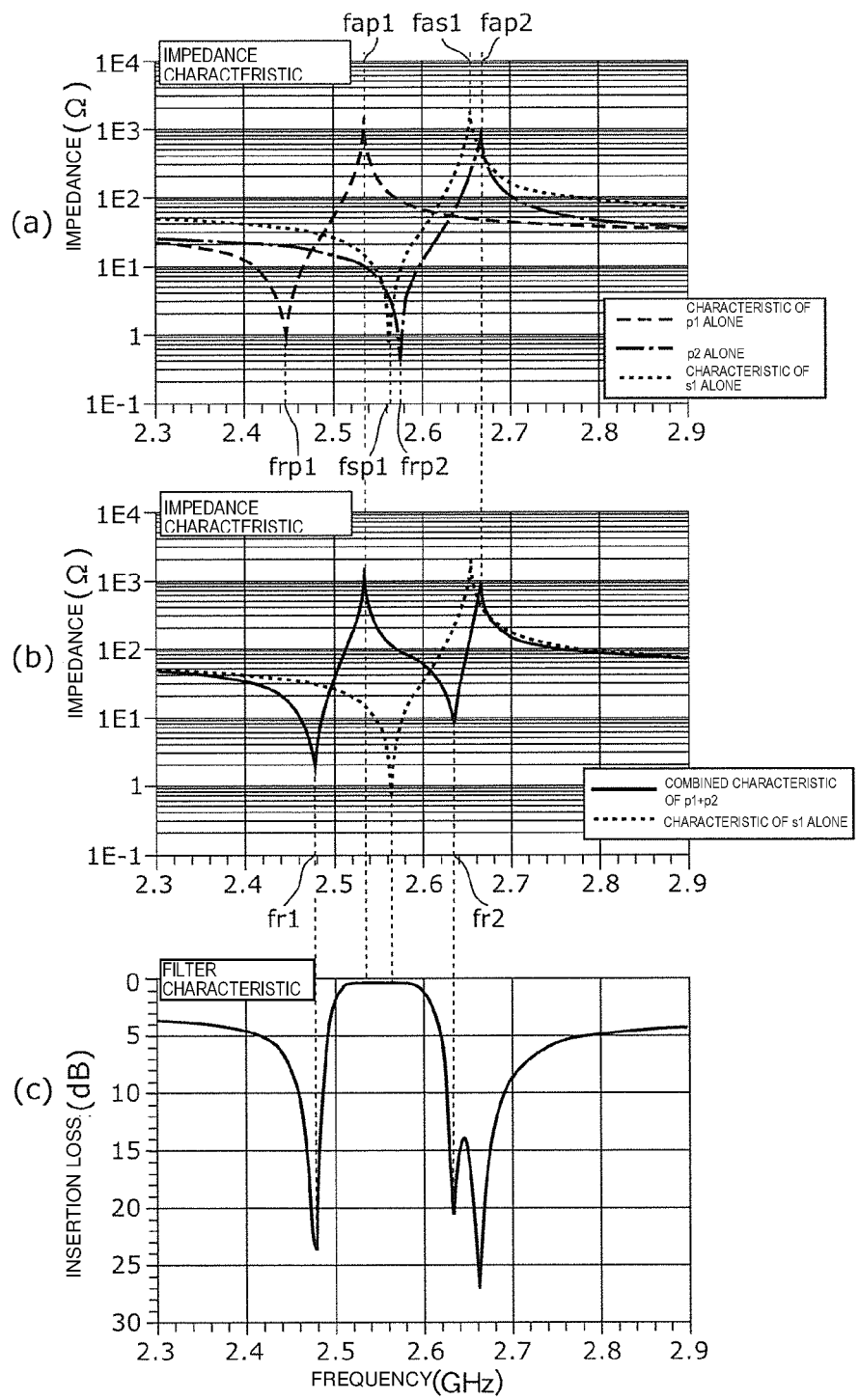
FIG. 3 illustrates graphs depicting characteristics of the filter according to the Preferred Embodiment 1 of the present invention.

FIG. 3 illustrates graphs depicting characteristics of the filter 10 according to Preferred Embodiment 1. Specifically, portion (a) of FIG. 3 is a graph depicting the respective impedance characteristics of the parallel-arm resonators p1 and p2 and the series-arm resonator s1. Portion (b) of FIG. 3 is a graph depicting the combined impedance characteristic (combined characteristic) of the parallel-arm resonators p1 and p2 and the impedance characteristic of the series-arm resonator s1. Portion (c) of FIG. 3 is a graph depicting a filter characteristic of the filter 10.

First, the impedance characteristics of resonators alone will be described with reference to portion (a) of FIG. 3.

As illustrated in FIG. 3, the parallel-arm resonator p1, the parallel-arm resonator p2, and the series-arm resonator s1 have the following impedance characteristics. Specifically, when the parallel-arm resonator p1, the parallel-arm resonator p2, and the series-arm resonator s1 have resonant frequencies frp1, frp2, and frs1 and anti-resonant frequencies fap1, fap2, and fas1, respectively, then in the present preferred embodiment, for example, frp1<frs1<frp2 and fap1<fas1<fap2 are preferably satisfied.

Next, the combined characteristic of the parallel-arm resonator p1 and the parallel-arm resonator p2 (i.e., the impedance characteristic of a parallel-arm resonant circuit) will be described.

As illustrated in portion (b) of FIG. 3, the combined characteristic of the two parallel-arm resonators (the parallel-arm resonators p1 and p2) ("combined characteristic of p1+p2" in FIG. 3) reaches a local minimum at a frequency fr1 between the resonant frequency frp1 and the anti-resonant frequency fap1 of the parallel-arm resonator p1 and at a frequency fr2 between the resonant frequency frp2 and the anti-resonant frequency fap2 of the parallel-arm resonator p2. Further, the combined characteristic reaches a local maximum at the anti-resonant frequency fap1 of the parallel-arm resonator p1 and the anti-resonant frequency fap2 of the parallel-arm resonator p2.

In the present preferred embodiment, the lower anti-resonant frequency among the two anti-resonant frequencies of the parallel-arm resonant circuit (i.e., fap1) and the resonant frequency frs1 of the series-arm resonator s1 define a pass band.

Accordingly, as illustrated in portion (c) of FIG. 3, an attenuation band including the frequency fr1 as an attenuation pole is generated on the low-frequency side of the pass band, and an attenuation band including the frequency fr2 and the anti-resonant frequency fast of the series-arm resonator s1 as attenuation poles is generated on the high-frequency side of the pass band.

In general, the I-R pitch is designed to be equivalent to the electrode pitch of the IDT electrode 121 (i.e., about $0.50\lambda$) in order to provide regularity for acoustic wave propagation. The inventor of preferred embodiments of the present invention has discovered a problem in that the use of a resonator designed as described above in an acoustic wave filter device in which a single parallel-arm resonant circuit includes a plurality of resonators may lead to deterioration (increase) in the loss within the pass band.

As a result of intensive research to address this problem, the inventor of preferred embodiments of the present invention has discovered that, in such an acoustic wave filter device, the I-R pitch for a resonator having a low resonant frequency and a low anti-resonant frequency among the plurality of resonators provided in the single parallel-arm resonant circuit is preferably set to about $0.42\lambda$ or more and less than about $0.50\lambda$, for example, thus reducing or preventing the deterioration of loss within the pass band described above. This mechanism will be described hereinafter with reference to a specific typical example.

Figure 4:
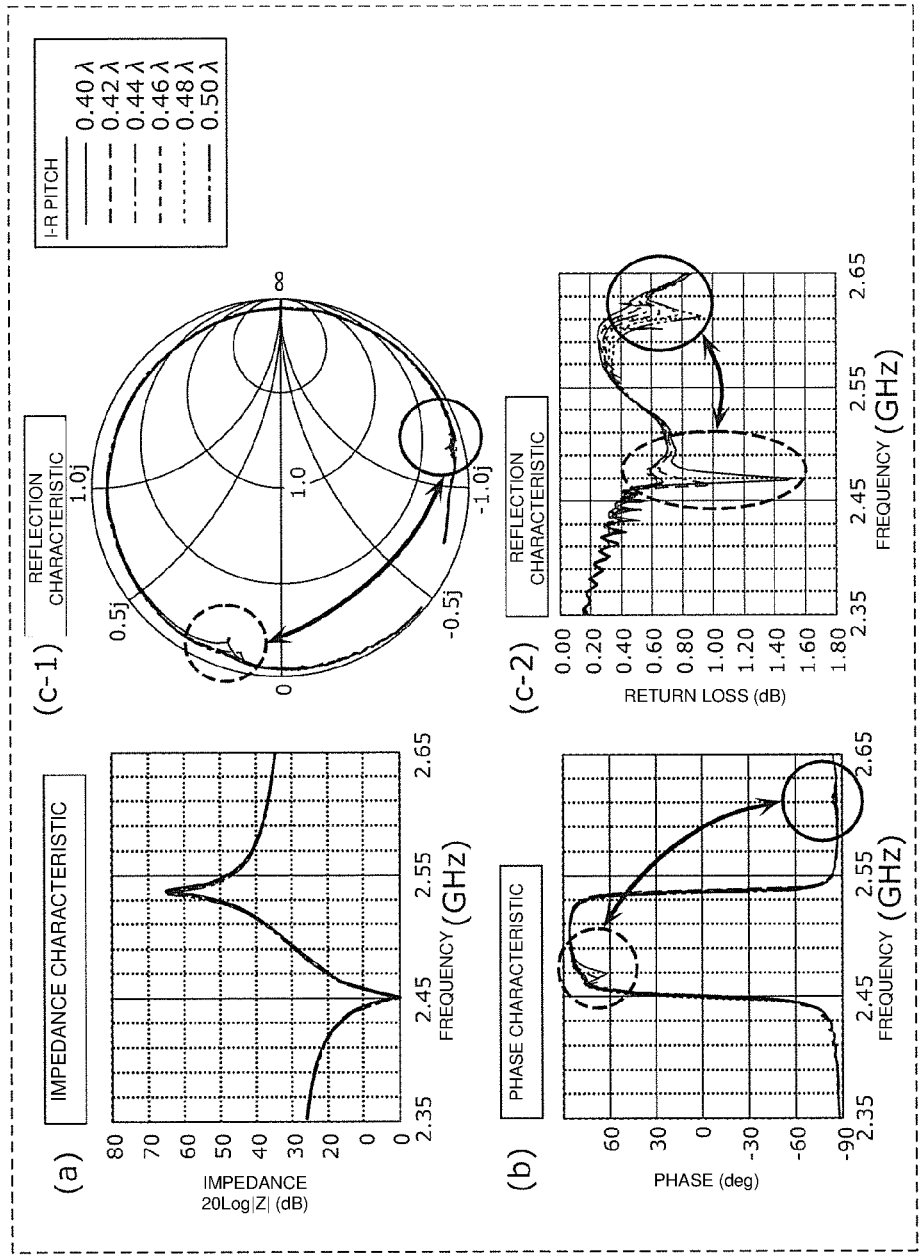
FIG. 4 illustrates graphs depicting changes in characteristic with varying I-R pitch for a resonator of a typical example.

FIG. 4 illustrates graphs depicting changes in reflection characteristic with varying I-R pitch for a resonator of a typical example. In FIG. 4, portion (a) is a graph depicting the absolute values of impedance, portion (b) is a graph depicting phase characteristics, portion (c-1) is a graph of the impedance that is plotted on the Smith chart, and portion (c-2) is a graph depicting return loss. Specifically, in FIG. 4, characteristics of the resonator, which are obtained when, as provided in the legends, the I-R pitch is changed from about $0.40\lambda$ to about $0.50\lambda$ in increments of about $0.02\lambda$, are illustrated.

FIG. 4 indicates that as the I-R pitch decreases, the ripples at the high-frequency end of the stop band (specifically, in a frequency range higher than the anti-resonant frequency) (indicated by solid-line encircled areas in portions (b), (c-1), and (c-2) of FIG. 4) are reduced. However, as the I-R pitch decrease, new ripples are generated (indicated by broken-line encircled areas in portions (b), (c-1), and (c-2) of FIG. 4) in a frequency range higher than the resonant frequency (specifically, in a range between the resonant frequency and the anti-resonant frequency), and these ripples increase in amplitude as the I-R pitch decreases.

For example, in an acoustic wave filter device in which a single parallel-arm resonant circuit includes only one parallel-arm resonator, when the parallel-arm resonator has a resonant frequency in a frequency range lower than the pass band and an anti-resonant frequency in the pass band, the resonant frequency of a series-arm resonator and the anti-resonant frequency of the parallel-arm resonator define a pass band. In this configuration, the width of the pass band and the steepness on the low-frequency side and high-frequency side of the pass band are determined by the respective band widths (frequency differences between the resonant frequencies and the anti-resonant frequencies) of the series-arm resonator and the parallel-arm resonator, and the anti-resonant frequency of the parallel-arm resonator and the resonant frequency of the series-arm resonator are located in the pass band. Accordingly, the high-frequency end of the stop band of the parallel-arm resonator is located outside the pass band (specifically, in a frequency range higher than the pass band). Thus, somewhat large ripples at the high-frequency end of the stop band may not significantly affect the filter characteristics (in particular, characteristics within the pass band).

However, the filter 10 according to the present preferred embodiment in which a single parallel-arm resonant circuit includes the two parallel-arm resonators p1 and p2 provides the combined characteristic of the two parallel-arm resonators p1 and p2, in which the frequency spacing between the frequency at which the impedance in the combined characteristic reaches a local maximum and the frequency at which the impedance reaches a local minimum (the frequency difference between the resonant frequency and the anti-resonant frequency) is smaller than that for the band widths of the parallel-arm resonator p1 and the parallel-arm resonator p2 alone. Thus, the high-frequency end of the stop band of the parallel-arm resonator p1 having a lower resonant frequency and a lower anti-resonant frequency may be located in the pass band. For example, when the resonator in the typical example is applied to the parallel-arm resonator p1, the high-frequency end of the stop band, namely, about 2.605 GHz, is located near the high-frequency end of the pass band (about 2.50 GHz or more and about 2.60 GHz or less) (see FIG. 3). In this case, accordingly, if ripples are generated at the high-frequency end of the stop band of the parallel-arm resonator p1, the loss within the pass band may be increased.

In contrast, setting the I-R pitch of the parallel-arm resonator p1 to less than about 0.50λ reduces the ripples at the high-frequency end of the stop band and reduces return loss within the range of frequencies from a frequency higher than the anti-resonant frequency up to the ripples at the high-frequency end of the stop band. Thus, the loss within the pass band caused by the ripples is able to be reduced.

In addition, the characteristic between the resonant frequency and the anti-resonant frequency of the parallel-arm resonator p1 may affect the characteristic between the lower resonant frequency and the lower anti-resonant frequency in the combined characteristic of the parallel-arm resonator p1 and the parallel-arm resonator p2 (see FIG. 3). That is, the lower resonant frequency in the combined characteristic defines an attenuation pole on the low-frequency side of the pass band, and the lower anti-resonant frequency in the combined characteristic defines a pass band. Thus, ripples between the resonant frequency and the anti-resonant frequency of the parallel-arm resonator p1 may increase the loss within the pass band or may deteriorate the attenuation characteristic on the low-frequency side of the pass band.

In contrast, setting the I-R pitch of the parallel-arm resonator p1 to about 0.42λ or more reduces the ripples, which may be generated in a frequency range higher than the resonant frequency of the parallel-arm resonator p1. Thus, the increase in loss within the pass band caused by the ripples or the deterioration of the attenuation characteristic on the low-frequency side of the pass band is able to be reduced or prevented.

In addition, setting the I-R pitch of the parallel-arm resonator p1 to about 0.44λ or more and about 0.46λ or less reduces (i) the ripples at the high-frequency end of the stop band, and (ii) the ripples that may be generated in a frequency range higher than the resonant frequency. Thus, the loss within the pass band caused by both of the ripples is able to be reduced.

The parallel-arm resonator p1 may not have a symmetrical electrode structure in the acoustic wave propagation direction, and may have an asymmetrical electrode structure. That is, the I-R pitch between the IDT electrode 121 and one of the reflectors 122 and the I-R pitch between the IDT electrode 121 and the other reflector 122 may be equal or may be different. This configuration is also able to achieve the same or similar advantages if the individual I-R pitches fall within the range described above.

Additionally, in the filter 10, either of (i) the ripples at the high-frequency end of the stop band and (ii) the ripples that may be generated in a frequency range higher than the resonant frequency may be problematic depending on the filter characteristics or other factors. To address this, when only (i) the ripples at the high-frequency end of the stop band are problematic, the I-R pitch of the parallel-arm resonator p1 may be set to less than about 0.44λ. When only (ii) the ripples that may be generated in a frequency range higher than the resonant frequency are problematic, on the other hand, the I-R pitch of the parallel-arm resonator p1 may be set to greater than about 0.46λ. That is, the I-R pitch may be designed, as desired, in a range greater than or equal to about 0.42λ and less than about 0.50λ by taking into account the filter characteristics required for the filter 10.

The following describes the effects achieved by the filter 10 according to the present preferred embodiment in detail with reference to an Example of a preferred embodiment of the present invention and a Comparative Example.

An acoustic wave filter device of the Example has a configuration similar to that of the filter 10 according to the preferred embodiment described above, and the I-R pitch is about 0.44λ. An acoustic wave filter device of the Comparative Example is the same or substantially the same as the acoustic wave filter device of the Example, except that the I-R pitch is about 0.50λ.

Figure 5A:
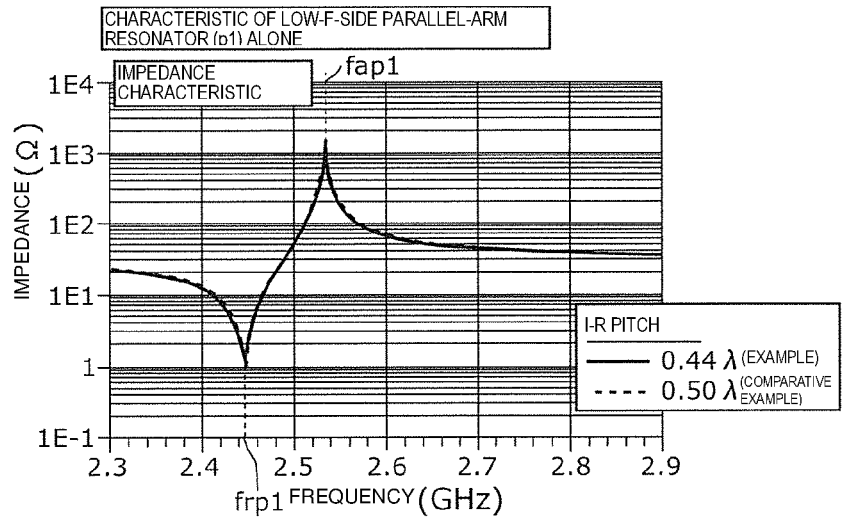
FIG. 5A is a graph depicting the absolute values of the impedance of the parallel-arm resonator.
Figure 5B:
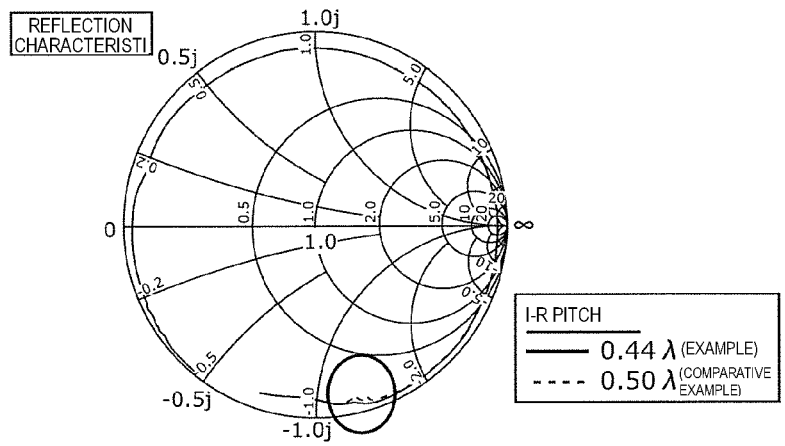
FIG. 5B is a graph of the impedance of the parallel-arm resonator that is plotted on the Smith chart.
Figure 5C:
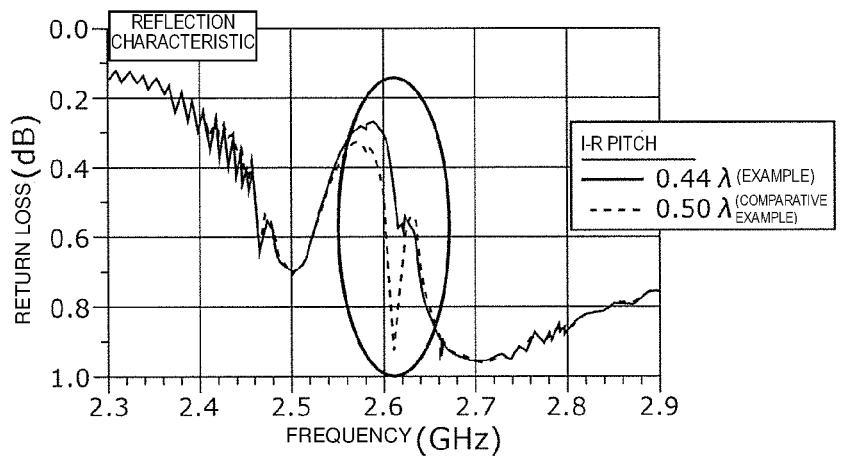
FIG. 5C is a graph depicting return loss of the parallel-arm resonator.
Figure 6:
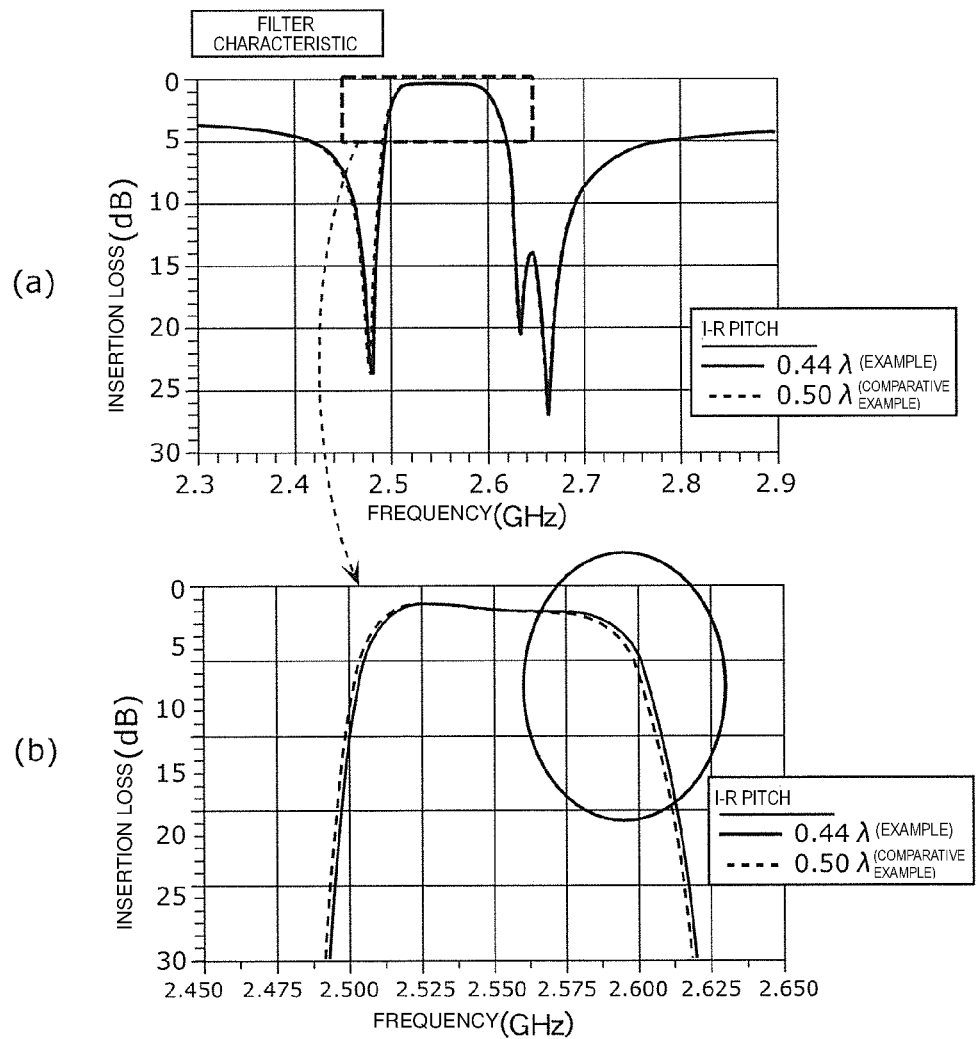
FIG. 6 illustrates graphs depicting filter characteristics in an Example of a preferred embodiment of the present invention and a Comparative Example.

FIGS. 5A to 5C are graphs depicting reflection characteristics of the parallel-arm resonator p1 alone having a lower resonant frequency and a lower anti-resonant frequency (low-f side), in the Example and the Comparative Example. Specifically, FIG. 5A is a graph depicting the absolute values of the impedance of the parallel-arm resonator p1, FIG. 5B is a graph of the impedance of the parallel-arm resonator p1 that is plotted on the Smith chart, and FIG. 5C is a graph depicting the return loss of the parallel-arm resonator p1. FIG. 6 illustrates graphs depicting filter characteristics (bandpass characteristics) in the Example and the Comparative Example, in which portion (a) is a graph depicting an overview of filter characteristics, and portion (b) is a graph depicting an enlarged view of the filter characteristics around the pass band illustrated in portion (a).

As is apparent from FIGS. 5A to 5C, in the Example with an I-R pitch of about 0.44λ, the ripples at the high-frequency end of the stop band (in a solid-line encircled area in FIGS. 5B to 5C) are reduced compared with the Comparative Example with an I-R pitch of about 0.50λ. Accordingly, as is apparent from FIG. 6, in the Example, loss is reduced or prevented at a frequency at which ripples at the high-frequency end of the stop band occurs (here, at the high-frequency end of the pass band), compared with the Comparative Example. That is, in the Example, the loss within the pass band caused by the ripples at the high-frequency end of the stop band is reduced or prevented as compared with the Comparative Example.

As is apparent from FIGS. 5A to 5C and FIG. 6, in the Example, the ripples in a frequency range higher than the resonant frequency (specifically, the ripples between the resonant frequency and the anti-resonant frequency) are increased to some extent, compared with the Comparative Example. However, such ripples have substantially no effect on the filter characteristics. That is, in the Example, the loss within the pass band caused by the ripples that may be generated in a frequency range higher than the resonant frequency is reduced or prevented.

As described above, as a result of intensive research, the inventor of preferred embodiments of the present invention has discovered that setting the I-R pitch of the parallel-arm resonator p1 (first parallel-arm resonator) (the pitch between the IDT electrode 121 and the reflectors 122) to about 0.42λ, or more and less than about 0.50λ, reduces the loss within the pass band. Specifically, if the I-R pitch is excessively large, ripples at the high-frequency end of the stop band of the parallel-arm resonator p1 are large, resulting in an increase in loss within the pass band. If the I-R pitch is excessively small, on the other hand, ripples in a frequency range higher than the resonant frequency of the parallel-arm resonator p1 are large, resulting in an increase in loss within the pass band or deterioration of the attenuation characteristic on the low-frequency side of the pass band. Thus, setting the I-R pitch of the parallel-arm resonator p1 to fall within a suitable range reduces the loss within the pass band.

According to the present preferred embodiment, furthermore, ripples at the high-frequency end of the stop band for which energy is concentrated in the pass band are able to be reduced. Thus, electric power handling capability and IMD (InterModulation Distortion) capability are able to be improved.

Additionally, the inventor of preferred embodiments of the present invention has discovered that, as a result of intensive research, setting the I-R pitch of the parallel-arm resonator p1 to about 0.44λ or more and about 0.46λ or less more reliably reduces or prevents the increase in loss within the pass band and reduces or prevents the deterioration of the attenuation characteristic on the low-frequency side of the pass band. Specifically, increasing the I-R pitch close to about 0.50λ reduces ripples in a frequency range higher than the resonant frequency of the parallel-arm resonator p1. However, it is difficult to reduce ripples at the high-frequency end of the stop band of the parallel-arm resonator p1. In contrast, reducing the I-R pitch close to about 0.42λ, reduces ripples at the high-frequency end of the stop band of the parallel-arm resonator p1. However, it is difficult to reduce ripples in a frequency range higher than the resonant frequency of the parallel-arm resonator p1. Therefore, setting the I-R pitch of the parallel-arm resonator p1 to about 0.44λ or more and about 0.46λ or less reduces both ripples at the high-frequency end of the stop band of the parallel-arm resonator p1 and ripples in a frequency range higher than the resonant frequency of the parallel-arm resonator p1. Thus, the loss within the pass band is able to be more reliably reduced.

Preferred Embodiment 2

The configuration of the filter 10 (acoustic wave filter device) according to the Preferred Embodiment 1 is applicable to a tunable filter having a variable pass band. Accordingly, such a tunable filter defined by a filter according to a Preferred Embodiment 2 of the present invention will be described with reference to Application Examples 1 to 6. Specifically, Application Examples 1 and 2 are application examples of the filter 10 according to the Preferred Embodiment 1 to a tunable filter. Application Examples 3 to 6 are application examples of a configuration in which the parallel-arm resonator p1 (first parallel-arm resonator) and the parallel-arm resonator p2 (second parallel-arm resonator) in the Preferred Embodiment 1 are connected in parallel to each other to a tunable filter.

A tunable filter is also able to reduce the loss within the pass band by setting the I-R pitch (the pitch between the IDT electrode 121 and the reflectors 122) of the parallel-arm resonator p1 (first parallel-arm resonator) to about 0.42λ or more and less than about 0.50λ. In addition, since a tunable filter is capable of changing the pass band, the size of a multi-band front-end circuit is able to be reduced.

The tunable filters in Application Examples 1 to 6 described below each include a switch element connected in series with or parallel to the parallel-arm resonator p1 or the parallel-arm resonator p2, and each have a pass band that is switched in accordance with the connection (ON) or disconnection (OFF) of the switch element. The switch element is turned on or off in accordance with a control signal from a control unit, such as an RF signal processing circuit (RFIC: Radio Frequency Integrated Circuit).

Application Example 1

Figure 7A:
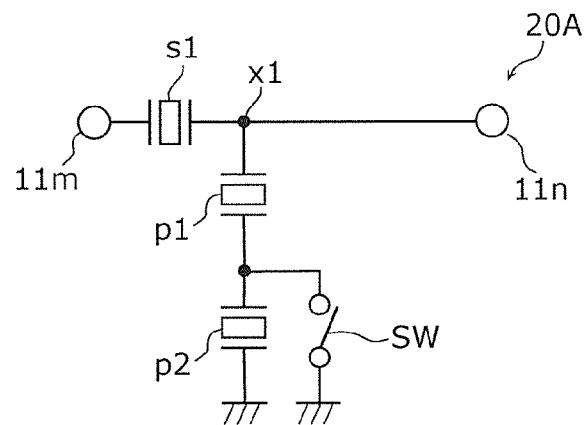
FIG. 7A is a circuit configuration diagram of a filter in an Application Example 1 of a Preferred Embodiment 2 of the present invention.

FIG. 7A is a circuit configuration diagram of a filter 20A in an Application Example 1 of the Preferred Embodiment 2.

Unlike the filter 10 illustrated in FIG. 1A, the filter 20A illustrated in FIG. 7A further includes a switch SW connected in parallel to one parallel-arm resonator among the parallel-arm resonators p1 and p2 (first and second parallel-arm resonators). The other parallel-arm resonator among the parallel-arm resonators p1 and p2 is connected in series with a circuit in which the one parallel-arm resonator and the switch SW are connected in parallel.

In the present application example, the switch SW is connected in parallel to the parallel-arm resonator p2. The switch SW may be connected in parallel to the parallel-arm resonator p1.

Figure 7B:
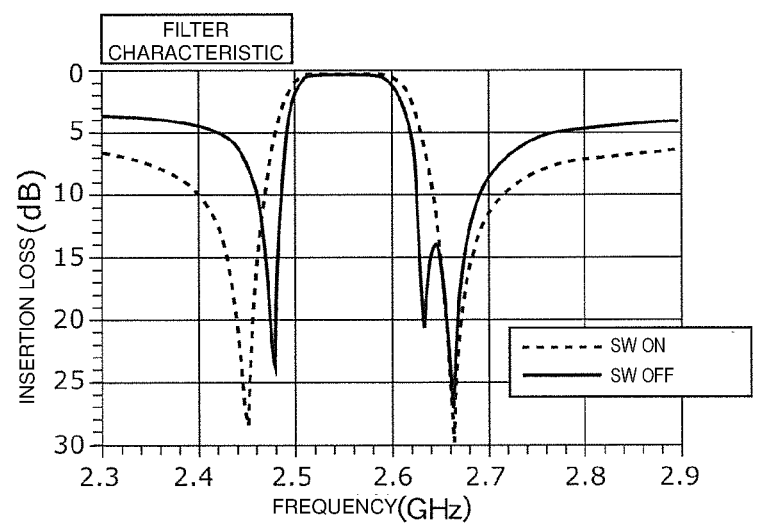
FIG. 7B is a graph depicting filter characteristics of the filter in the Application Example 1 of the Preferred Embodiment 2 of the present invention.

FIG. 7B is a graph depicting filter characteristics of the filter 20A in the Application Example 1 of the Preferred Embodiment 2. Specifically, FIG. 7B is a graph depicting a comparison of filter characteristics when the switch SW is on and when the switch SW is off.

In the present application example, the parallel-arm resonator p2 is added to the parallel-arm resonator p1 only when the switch SW is off. Thus, as illustrated in FIG. 7B, the switch SW is switched from on to off, thus shifting, in the bandpass characteristic of the filter 20A, the attenuation pole on the low-frequency side of the pass band to a higher range. Additionally, an additional attenuation pole is generated on the high-frequency side of the pass band. Thus, attenuation on the high-frequency side of the pass band is also able to be obtained. In other words, the filter 20A may switch the attenuation pole frequency on the low-frequency side of the pass band in accordance with switching between the on and off of the switch SW, and may switch the number of attenuation poles on the high-frequency side of the pass band.

Application Example 2

Figure 8A:
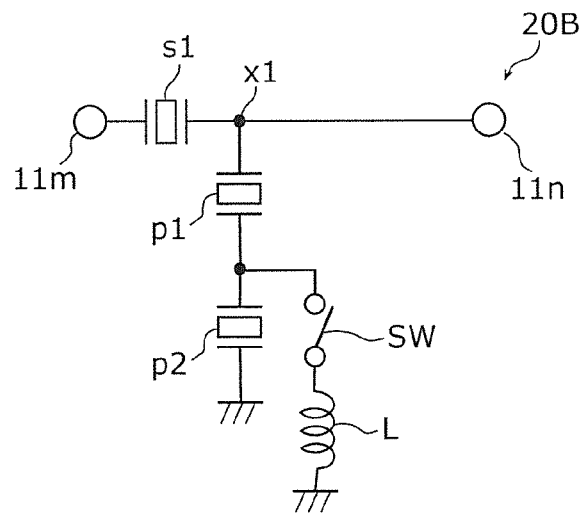
FIG. 8A is a circuit configuration diagram of a filter in an Application Example 2 of the Preferred Embodiment 2 of the present invention.

FIG. 8A is a circuit configuration diagram of a filter 20B in an Application Example 2 of the Preferred Embodiment 2.

Unlike the filter 20A in the Application Example 1, the filter 20B illustrated in FIG. 8A further includes an inductor L connected in series with the switch SW. That is, in the present application example, a series circuit including the switch SW and the inductor L is connected in parallel to the parallel-arm resonator p2, and the parallel-connected circuit is connected in series with the parallel-arm resonator p1. In the present application example, the inductor L is connected to the ground side. Alternatively, the switch SW may be connected to the ground side.

The inductor L is an impedance element connected in series with the parallel-arm resonator p1. The frequency variable width of the pass band of the filter 20B depends on the constant of the inductor L (in the present application example, the inductor L and the parallel-arm resonator p2). For example, the frequency variable width increases as the constant of the inductor increases. Thus, the constant of the inductor L may be determined, as desired, in accordance with the frequency specifications required for the filter 20B. Further, the inductor may preferably be, for example, a MEMS (Micro Electro Mechanical Systems) variable inductor. Accordingly, the frequency variable width is able to be finely adjusted.

Figure 8B:
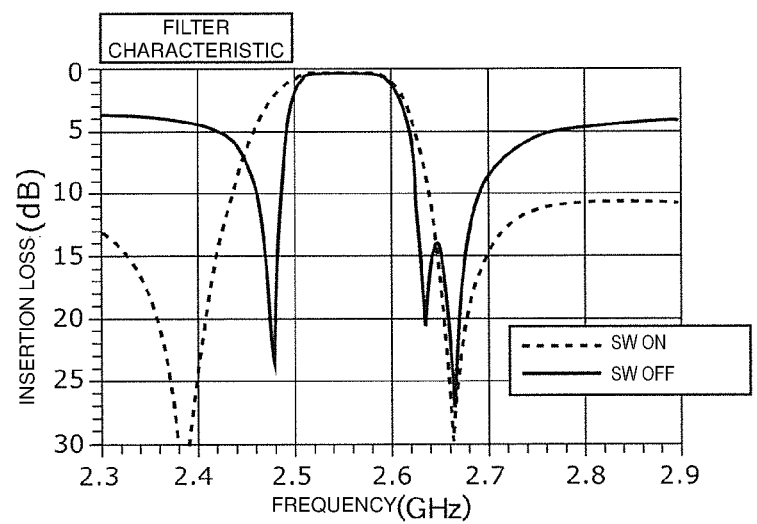
FIG. 8B is a graph depicting filter characteristics of the filter in the Application Example 2 of the Preferred Embodiment 2 of the present invention.

FIG. 8B is a graph depicting filter characteristics of the filter 20B in the Application Example 2 of the Preferred Embodiment 2. Specifically, FIG. 8B is a graph depicting a comparison of filter characteristics when the switch SW is on and when the switch SW is off.

In the present application example, the inductor L is added to the parallel-arm resonator p1 when the switch SW is on. Thus, in the bandpass characteristic of the filter 20B when the switch SW is on, the attenuation pole on the low-frequency side of the pass band is shifted to a lower range, as compared with the bandpass characteristic of the filter 20A in the Application Example 1 described above when the switch SW is on. When the switch SW is off, the parallel-arm resonator p2 is added to the parallel-arm resonator p1. Thus, in the bandpass characteristic of the filter 20B, as illustrated in FIG. 8B, the attenuation pole on the low-frequency side of the pass band when the switch SW is on is shifted to a further lower range, as compared with FIG. 7B.

The impedance element is not limited to an inductor and may be a capacitor, for example. When a capacitor is used as an impedance element, the direction in which an attenuation pole is shifted in response to the switching of the on and off of the switch SW is different than that in the configuration described above. The frequency variable width of the pass band of the filter 20B depends on the constant of the capacitor. For example, the frequency variable width increases as the constant of the capacitor decreases. Thus, the constant of the capacitor may be determined, as desired, in accordance with the frequency specifications required for the filter 20A. In this case, the capacitor C may preferably be, for example, a variable capacitor such as a varicap and a DTC (Digital Tunable Capacitor). Accordingly, the frequency variable width is able to be finely adjusted.

Application Example 3

Figure 9A:
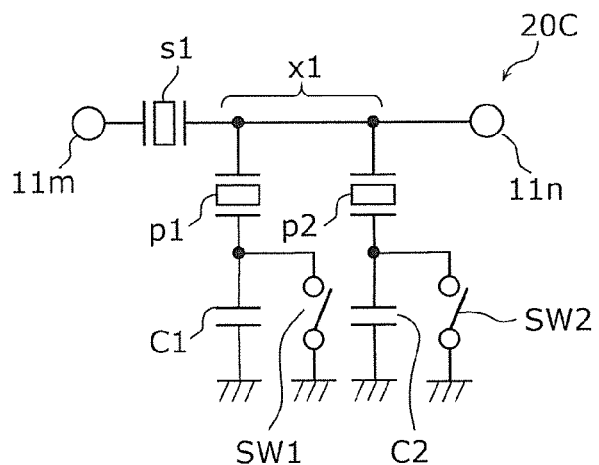
FIG. 9A is a circuit configuration diagram of a filter in an Application Example 3 of the Preferred Embodiment 2 of the present invention.

FIG. 9A is a circuit configuration diagram of a filter 20C in an Application Example 3 of the Preferred Embodiment 2.

As illustrated in FIG. 9A, in the present application example, the parallel-arm resonators p1 and p2 are each connected between the node x1 and ground. That is, the parallel-arm resonator p1 and the parallel-arm resonator p2 are connected to the same node on a path connecting the input/output terminal 11m and the input/output terminal 11n.

The filter 20C further includes a capacitor C1 and a switch SW1 that are connected in series with only the parallel-arm resonator p1 between the node x1 and ground, and a capacitor C2 and a switch SW2 that are connected in series with only the parallel-arm resonator p2 between the node x1 and ground.

In other words, the filter 20C includes two impedance circuits, each including a capacitor and a switch connected in parallel. Further, the parallel-arm resonator p1 (first parallel-arm resonator) is connected in series with one impedance circuit among the two impedance circuits, which includes the capacitor C1 and the switch SW1. The parallel-arm resonator p2 (second parallel-arm resonator) is connected in series with the other impedance circuit among the two impedance circuits, which includes the capacitor C2 and the switch SW2. Further, a circuit in which the parallel-arm resonator p1 and the one impedance circuit are connected in series and a circuit in which the parallel-arm resonator p2 and the other impedance circuit are connected in series are connected in parallel.

In the present application example, the capacitor C1 and the switch SW1 are connected between the parallel-arm resonator p1 and ground. Alternatively, the capacitor C1 and the switch SW1 may be connected between the parallel-arm resonator p1 and the node x1. This also applies to the relationship between the capacitor C2 and the switch SW2 and the relationship between the capacitor C2 and the parallel-arm resonator p2.

Figure 9B:
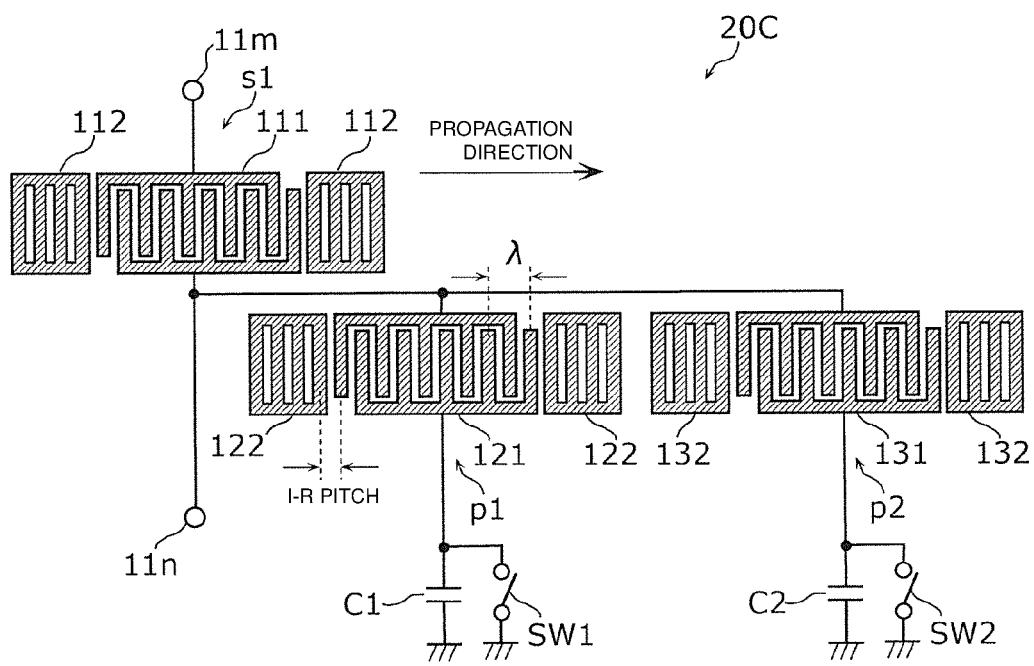
FIG. 9B is a schematic plan view of an electrode structure of the filter in the Application Example 3 of the Preferred Embodiment 2 of the present invention.

FIG. 9B is a schematic plan view of an electrode structure of the filter 20C in the Application Example 3 of the Preferred Embodiment 2. In FIG. 9B, circuit elements (the capacitors C1 and C2 and the switches SW1 and SW2) of the filter 20C other than resonators are also schematically illustrated.

As illustrated in FIG. 9B, the parallel-arm resonator p1 and the parallel-arm resonator p2 are disposed in the acoustic wave propagation direction. The configuration of the parallel-arm resonator p1 and the parallel-arm resonator p2 is not limited to the illustrated configuration, and, for example, as illustrated in FIG. 1B, the parallel-arm resonator p1 and the parallel-arm resonator p2 may be disposed in a direction vertical to the acoustic wave propagation direction.

Figure 9C:
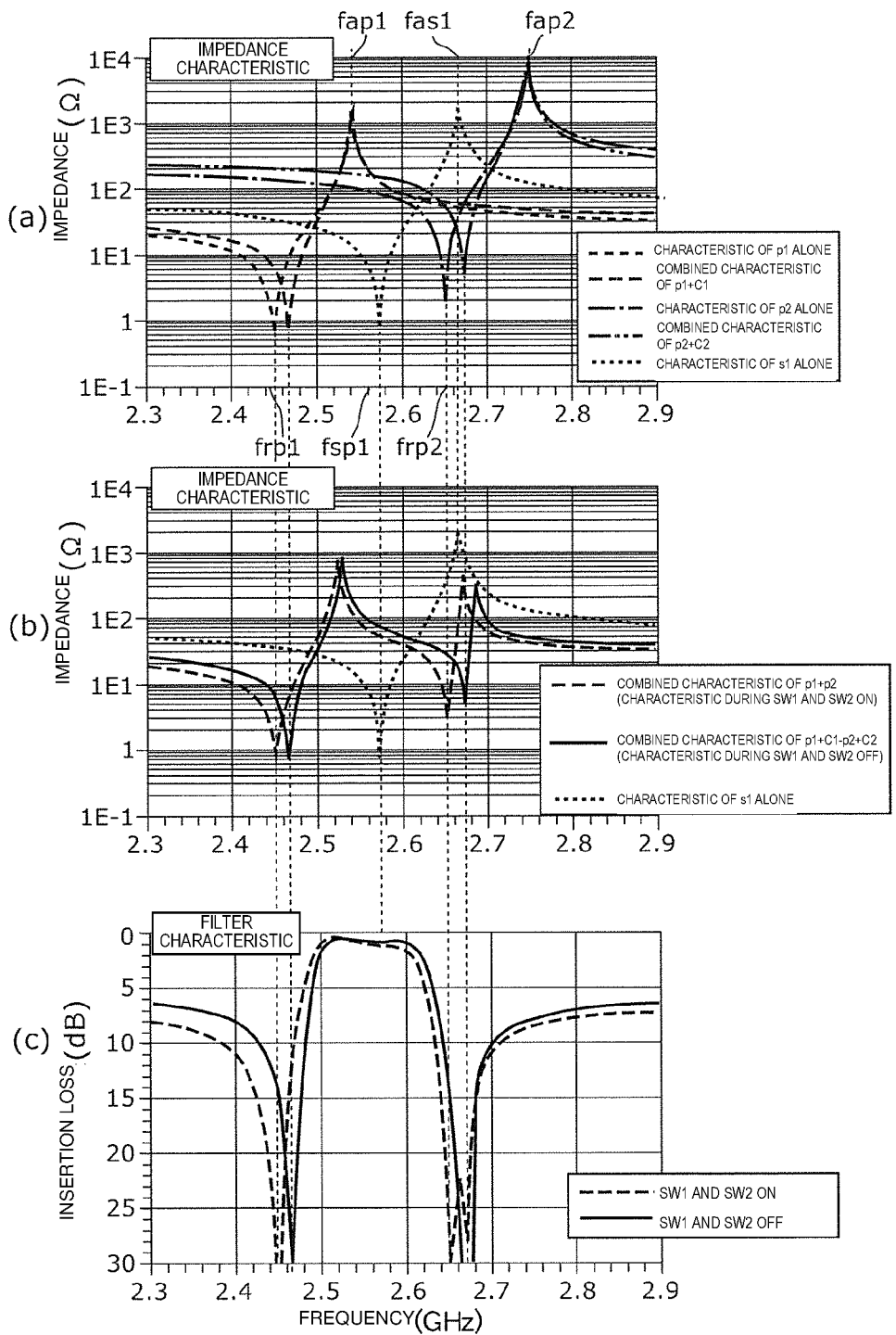
FIG. 9C illustrates graphs depicting characteristics of the filter in the Application Example 3 of the Preferred Embodiment 2 of the present invention.

FIG. 9C illustrates graphs depicting characteristics of the filter 20C in the Application Example 3 of the Preferred Embodiment 2. Specifically, portions (a) and (b) of FIG. 9C are graphs depicting the impedance characteristics of resonators alone, the combined characteristic of the parallel-arm resonator p1 and the capacitor C1 ("combined characteristic of p1+C1" in FIG. 9C), the combined characteristic of the parallel-arm resonator p2 and the capacitor C2 ("combined characteristic of p2+C2" in FIG. 9C), the combined characteristic of a parallel-arm resonant circuit when both the switches SW1 and SW2 are on ("combined characteristic of p1+p2" in FIG. 9C), and the combined characteristic of a parallel-arm resonant circuit when both the switches SW1 and SW2 are off ("combined characteristic of p1+C1+p2+C2" in FIG. 9C). In the present application example, the parallel-arm resonant circuit is disposed in the path connecting the node x1 and ground, and specifically, includes the parallel-arm resonator p1, the capacitor C1, the switch SW1, the parallel-arm resonator p2, the capacitor C2, and the switch SW2. Portion (c) of FIG. 9C is a graph depicting a comparison of filter characteristics when both of the switches SW1 and SW2 are on or off.

In the present application example, when both of the switches SW1 and SW2 are off, the capacitor C1 is added to the parallel-arm resonator p1 and the capacitor C2 is added to the parallel-arm resonator p2. Thus, as illustrated in portion (b) of FIG. 9C, when the switches SW1 and SW2 are both switched from on to off, in the combined characteristic of the parallel-arm resonant circuit, both of the two resonant frequencies and the lower anti-resonant frequency out of the two anti-resonant frequencies are shifted to higher ranges.

Accordingly, as illustrated in portion (c) of FIG. 9C, the switches SW1 and SW2 are both switched from on to off, thus shifting, in the bandpass characteristic of the filter 20C, the attenuation slopes on the high-frequency side of the pass band and the low-frequency side of the pass band to higher ranges with their steepness maintained. In other words, the filter 20C is able to switch the attenuation pole frequencies on the high-frequency side of the pass band and the low-frequency side of the pass band in accordance with switching between the connection and disconnection of the switches SW1 and SW2, and reduce or prevent the increase in insertion loss at the high-frequency end of the pass band and at the low-frequency end of the pass band. Thus, for example, the filter 20C is able to switch the center frequency while maintaining the band width.

In the filter 20C, the on and off of the switches SW1 and SW2 may not be switched together, but may be switched separately. However, switching the on and off the switches SW1 and SW2 together is able to reduce the number of control lines to control the switches SW1 and SW2, simplifying the configuration of the filter 20C.

In contrast, switching the on and off of the switches SW1 and SW2 separately provides more variations in the pass band that are able to be switched by the filter 20C.

Specifically, the high-frequency end of the pass band is able to be varied in accordance with the on and off of the switch SW2 connected in series with the parallel-arm resonator p2. Further, the low-frequency end of the pass band is able to be varied in accordance with the on and off of the switch SW1 connected in series with the parallel-arm resonator p1.

Thus, turning on or off both of the switches SW1 and SW2 shifts the low-frequency end and the high-frequency end of the pass band to lower ranges or higher ranges. That is, the center frequency of the pass band is able to be shifted to a lower range or a higher range. In addition, switching one of the switches SW1 and SW2 from on to off and the other switch from off to on is able to shift both the low-frequency end and the high-frequency end of the pass band so as to increase or reduce the frequency difference. That is, the width of the pass band is able to be varied with the center frequency of the pass band maintained constant or substantially constant. Additionally, when one of the switches SW1 and SW2 is in the on or off state, turning on and off the other switch shifts, with one of the low-frequency end and the high-frequency end of the pass band fixed, the other frequency end to a lower range or a higher range. That is, the low-frequency end or the high-frequency end of the pass band is able to be changed.

Accordingly, the use of the capacitors C1 and C2 and the switches SW1 and SW2 improves the flexibility of changing the pass band.

In the filter 20C capable of shifting the high-frequency end of the pass band, in particular, when the high-frequency end of the pass band is shifted to a higher range, the high-frequency end of the stop band of the parallel-arm resonator p1 is likely to be located in the pass band. That is, in this case, if ripples occur at the high-frequency end of the stop band of the parallel-arm resonator p1, the loss within the pass band may be increased. In the filter 20C, accordingly, setting the I-R pitch of the parallel-arm resonator p1 to about $0.42\lambda$, or more and less than about $0.50\lambda$, is useful, in particular in terms of reduction in loss within the pass band.

A filter may include a single impedance circuit including an impedance element (e.g., a capacitor) and a switch that are connected in parallel, and at least one of the parallel-arm resonators p1 and p2 may be connected in series with the impedance circuit. Accordingly, such a filter will be described with reference to the Application Examples 4 to 6.

Application Example 4

Figure 10:
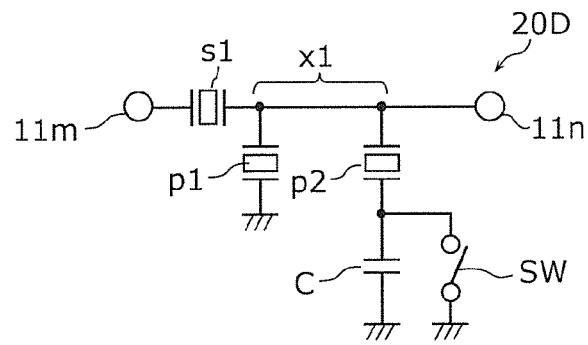
FIG. 10 is a circuit configuration diagram of a filter in an Application Example 4 of the Preferred Embodiment 2 of the present invention.

FIG. 10 is a circuit configuration diagram of a filter 20D in an Application Example 4 of the Preferred Embodiment 2.

In the filter 20D illustrated in FIG. 10, unlike the filter 20C illustrated in FIG. 9A, the parallel-arm resonator p1 connects the node x1 and ground without the capacitor C1 and the switch SW1. In FIG. 10, a capacitor C and a switch SW correspond to the capacitor C2 and the switch SW2 illustrated in FIG. 9A. In other words, the filter 20D includes an impedance circuit including the capacitor C and the switch SW connected in parallel. Further, the parallel-arm resonator p2 (second parallel-arm resonator) is connected in series with the impedance circuit, and the parallel-arm resonator p1 (first parallel-arm resonator) is connected in parallel to a circuit in which the parallel-arm resonator p2 and the impedance circuit are connected in series.

That is, a filter characteristic of the filter 20D in the present application example corresponds to a characteristic obtained when in Application Example 3 described above, the on and off of the switch SW2 are switched with the switch SW1 fixed to the on state. That is, the filter 20D is able to switch between a first characteristic and a second characteristic with a reduced of prevented increase in insertion loss at the high-frequency end of the pass band while switching the attenuation pole frequency on the high-frequency side of the pass band in accordance with switching between the connection and disconnection of the switch SW.

Application Example 5

Figure 11:
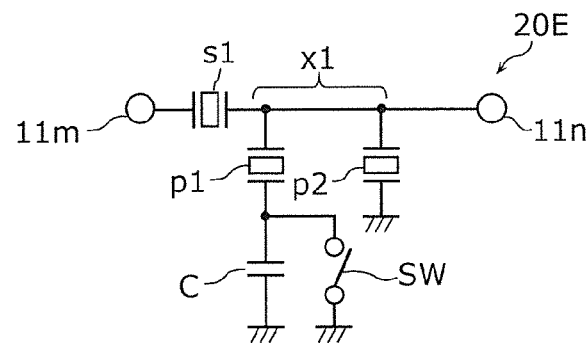
FIG. 11 is a circuit configuration diagram of a filter in an Application Example 5 of the Preferred Embodiment 2 of the present invention.

FIG. 11 is a circuit configuration diagram of a filter 20E in an Application Example 5 of the Preferred Embodiment 2.

In the filter 20E illustrated in FIG. 11, unlike the filter 20C illustrated in FIG. 9A, the parallel-arm resonator p2 connects the node x1 and ground without the capacitor C2 and the switch SW2. In FIG. 11, a capacitor C and a switch SW correspond to the capacitor C1 and the switch SW1 illustrated in FIG. 9A. In other words, the filter 20E includes an impedance circuit including the capacitor C and the switch SW connected in parallel. Further, the parallel-arm resonator p1 (first parallel-arm resonator) is connected in series with the impedance circuit, and the parallel-arm resonator p2 (second parallel-arm resonator) is connected in parallel to a circuit in which the parallel-arm resonator p1 and the impedance circuit are connected in series.

That is, a filter characteristic of the filter 20E in the present application example corresponds to a characteristic obtained when in Application Example 3 described above, the on and off of the switch SW1 are switched with the switch SW2 fixed to the on state. That is, the filter 20E is able to switch between a first characteristic and a second characteristic with a reduced or prevented increase in insertion loss at the low-frequency end of the pass band while switching the attenuation pole frequency on the low-frequency side of the pass band in accordance with switching between the connection and disconnection of the switch SW.

Application Example 6

Figure 12:
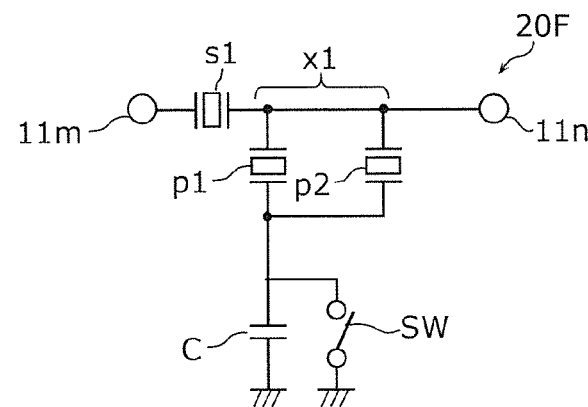
FIG. 12 is a circuit configuration diagram of a filter in an Application Example 6 of the Preferred Embodiment 2 of the present invention.

FIG. 12 is a circuit configuration diagram of a filter 20F in an Application Example 6 of the Preferred Embodiment 2.

In the filter 20F illustrated in FIG. 12, unlike the filter 20D illustrated in FIG. 10 and the filter 20E illustrated in FIG. 11, a capacitor C and a switch SW, which are connected in parallel, are connected in series with a circuit in which the parallel-arm resonator p1 and the parallel-arm resonator p2 are connected in parallel. In other words, in the filter 20F, an impedance circuit including the capacitor C and the switch SW is connected in series with a circuit in which the parallel-arm resonator p1 and the parallel-arm resonator p2 are connected in parallel.

In the present application example, when the switch SW is off, the capacitor C is added to the parallel-arm resonators p1 and p2, which are connected in parallel. Accordingly, in a bandpass characteristic when the switch SW is off, unlike a bandpass characteristic when the switch SW is on, both of the poles (attenuation poles) on both sides of the pass band are shifted to higher ranges. That is, filter 20F is able to switch both pole (attenuation pole) frequencies on both sides of the pass band in accordance with switching between the connection and disconnection of the switch SW.

Preferred Embodiment 3

The filters (acoustic wave filter devices) according to the Preferred Embodiments 1 and 2 described above are applicable to a radio-frequency front-end circuit and other suitable circuits and devices.

In Preferred Embodiment 3 of the present invention, a radio-frequency front-end circuit will be described.

Figure 13:
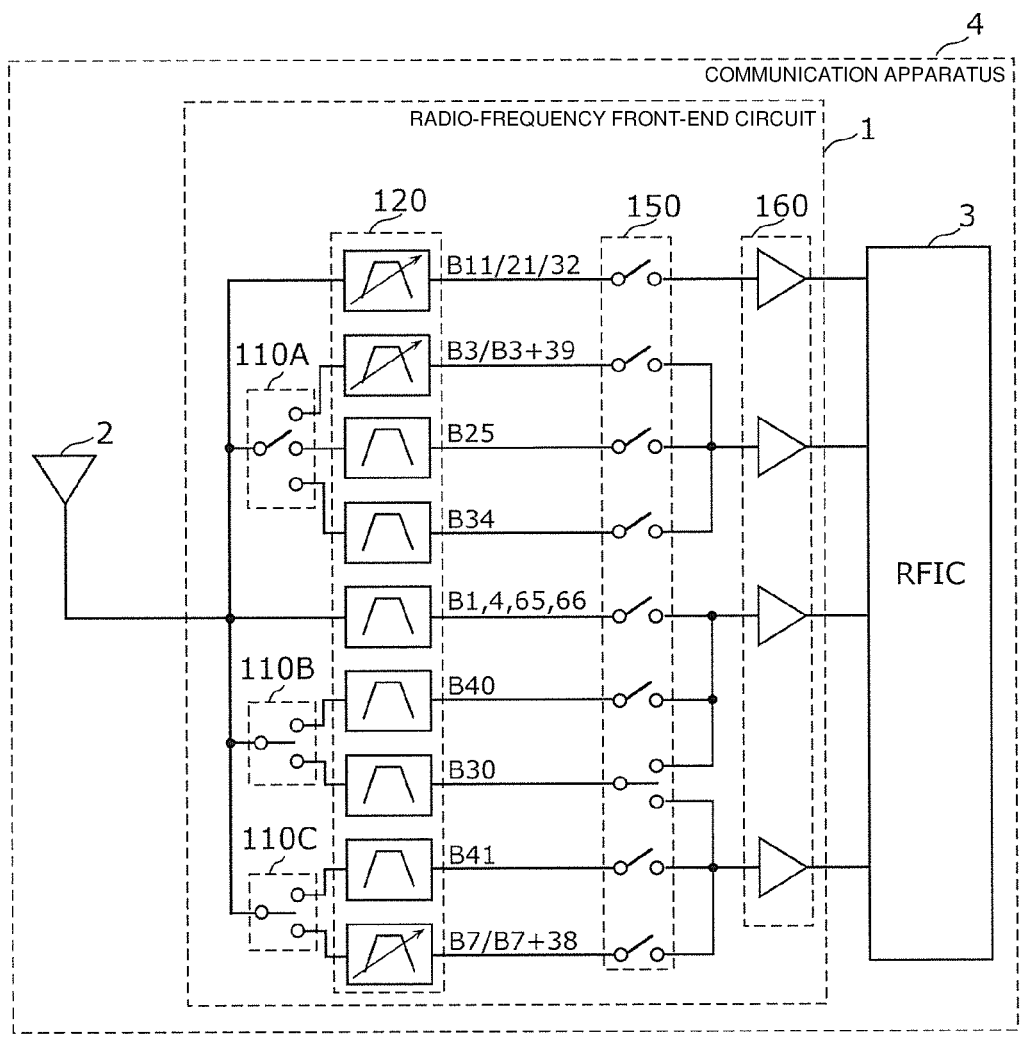
FIG. 13 is a configuration diagram of a radio-frequency front-end circuit according to a Preferred Embodiment 3 of the present invention and its peripheral circuit.

FIG. 13 is a configuration diagram of a radio-frequency front-end circuit 1 according to the Preferred Embodiment 3 and its peripheral circuit. In FIG. 13, the radio-frequency front-end circuit 1, an antenna element 2, and an RF signal processing circuit (RFIC) 3 are illustrated. The radio-frequency front-end circuit 1, the antenna element 2, and the RFIC 3 define a communication apparatus 4. The antenna element 2, the radio-frequency front-end circuit 1, and the RFIC 3 are provided in a front-end portion of a multi-mode/multi-band cellular phone, for example.

The antenna element 2 is preferably, for example, a multi-band antenna complying with a communication standard such as 3GPP (Third Generation Partnership Project) and configured to transmit and receive radio-frequency signals. For example, the antenna element 2 may not support all of the bands of the communication apparatus 4, and may support only bands in a low-frequency band group or a high-frequency band group. Further, the antenna element 2 may not be included in the communication apparatus 4, but may be disposed separately from the communication apparatus 4.

The RFIC 3 is preferably, for example, an RF signal processing circuit that processes a radio-frequency signal transmitted or received by the antenna element 2. Specifically, the RFIC 3 performs signal processing on a radio frequency reception signal input from the antenna element 2 via a reception-side signal path of the radio-frequency front-end circuit 1 by using down-conversion, for example, to generate a reception signal, and outputs the reception signal to a baseband signal processing circuit (not illustrated). Further, the RFIC 3 performs signal processing on a transmission signal input from the baseband signal processing circuit by using up-conversion, for example, to generate a radio frequency transmission signal, and outputs the radio frequency transmission signal to a transmission-side signal path (not illustrated) of the radio-frequency front-end circuit 1.

The radio-frequency front-end circuit 1 is a circuit that transmits a radio-frequency signal between the antenna element 2 and the RFIC 3. Specifically, the radio-frequency front-end circuit 1 transmits a radio frequency transmission signal output from the RFIC 3 to the antenna element 2 via the transmission-side signal path (not illustrated). Further, the radio-frequency front-end circuit 1 transmits a radio frequency reception signal received by the antenna element 2 to the RFIC 3 via the reception-side signal path. While the present preferred embodiment describes a configuration in which the filter according to Preferred Embodiments 1 and 2 is disposed in the reception-side signal path of the radio-frequency front-end circuit 1, the filter may be disposed in the transmission-side signal path of the radio-frequency front-end circuit 1.

The radio-frequency front-end circuit 1 includes, in sequence from the antenna element 2 side, a switch group 110A to 110C including a plurality of switches, a filter group 120 including a plurality of filters, a switch group 150, and a reception amplifier circuit group 160.

The switch group 110A to 110C includes one or more switches (in the present preferred embodiment, preferably a plurality of switches), each connecting the antenna element 2 and a signal path supporting a predetermined band in accordance with a control signal from the control unit (not illustrated). The number of signal paths to be connected to the antenna element 2 is not limited to one, and a plurality of signal paths may be connected to the antenna element 2. That is, the radio-frequency front-end circuit 1 may support carrier aggregation.

The filter group 120 includes one or more filters. In the present preferred embodiment, for example, the filter group 120 preferably includes a plurality of filters, for example, as follows: (i) a tunable filter capable of supporting Bands 11, 21, and 32, (ii) a tunable filter capable of supporting Band 3 and supporting CA (carrier aggregation) with Bands 3 and 9, (iii) a filter supporting Band 25, (iv) a filter supporting Band 34, (v) a filter supporting Bands 1, 4, 65, and 66, (vi) a filter supporting Band 40, (vii) a filter supporting Band 30, (viii) a filter supporting Band 41, and (ix) a tunable filter capable of supporting Band 7 and supporting CA with Bands 7 and 38.

The switch group 150 includes one or more switches (in the present preferred embodiment, preferably a plurality of switches), each connecting a signal path supporting a predetermined band and a reception amplifier circuit supporting the predetermined band in the reception amplifier circuit group 160 in accordance with a control signal from the control unit (not illustrated). The number of signal paths to be connected to the antenna element 2 is not limited to one, and a plurality of signal paths may be connected to the antenna element 2. That is, the radio-frequency front-end circuit 1 may support carrier aggregation. Accordingly, a radio-frequency signal input from the antenna element 2 (here, a radio frequency reception signal) is amplified by a predetermined reception amplifier circuit in the reception amplifier circuit group 160 via a predetermined filter in the filter group 120, and is output to the RFIC 3. An RFIC supporting low bands and an RFIC supporting high bands may be separately provided.

The reception amplifier circuit group 160 includes one or more low-noise amplifiers (in the present preferred embodiment, preferably a plurality of low-noise amplifiers), each amplifying the power of a radio frequency reception signal input from the switch group 150.

The radio-frequency front-end circuit 1 having the configuration described above includes any one of the filter 20A to 20F in the application examples of the Preferred Embodiment 2 described above as at least one tunable filter. Accordingly, the number of filters is able to be reduced, as compared with when a filter is disposed for each band, and thus, the size of the radio-frequency front-end circuit 1 is able to be reduced.

Alternatively, the radio-frequency front-end circuit 1 may include the filter 10 according to Preferred Embodiment 1 described above as a filter whose pass band is fixed.

While acoustic wave filter devices and radio-frequency front-end circuits according to preferred embodiments of the present invention have been described with reference to the Preferred Embodiments 1 to 3, the present invention is not limited to the preferred embodiments described above. Any of the elements in the preferred embodiments described above may be combined to provide other preferred embodiments, or various modifications conceived of by a person skilled in the art without departing from the gist of the present invention may be made to the preferred embodiments. Such preferred embodiments and modifications and various devices including acoustic wave filter devices and a radio-frequency front-end circuits according to preferred embodiments of the present invention are also included in the present invention.

For example, the communication apparatus 4 including the radio-frequency front-end circuit described above and the RFIC 3 (RF signal processing circuit) is also included in the present invention. The communication apparatus 4 having the configuration described above is able to achieve low loss and high selectivity.

In addition, a multiplexer, such as a duplexer, for example, including any of the filters described above is also included in preferred embodiments of the present invention. That is, in a multiplexer including a plurality of filters that are connected in common, at least one filter may be any of the filters described above.

Furthermore, the series-arm resonator s1 and the parallel-arm resonator p2 are not limited to acoustic wave resonators that use surface acoustic waves, and may be, for example, acoustic wave resonators that use bulk waves or boundary acoustic waves. That is, the series-arm resonator s1 and the parallel-arm resonator p2 may not be defined by IDT electrodes.

Furthermore, in terms of low loss, each of the series-arm resonator s1 and the parallel-arm resonator p2 includes reflectors. However, for example, if there are constraints on the mounting layout and other constraints, the series-arm resonator s1 and the parallel-arm resonator p2 may not include a reflector. That is, at least one of the series-arm resonator s1 and the parallel-arm resonator p2 may include only the IDT electrode without including a pair of reflectors.

Alternatively, the series-arm resonator s1 and at least one of the parallel-arm resonators p1 and p2 may include only one reflector.

Furthermore, for example, in radio-frequency front-end circuits or communication apparatuses according to preferred embodiments of the present invention, an inductor or a capacitor may be connected between individual components. The inductor may include a wiring inductor defined by wiring that connects individual components.

Preferred embodiments of the present invention provide low-loss filters, multiplexers, front-end circuits, and communication apparatuses, which may be widely used in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   a series-arm resonant circuit including one or more acoustic wave resonators that are connected on a path connecting a first input/output terminal and a second input/output terminal; and
   a first parallel-arm resonator and a second parallel-arm resonator that are connected between a same node on the path and ground; wherein
   a resonant frequency of the first parallel-arm resonator is lower than a resonant frequency of the second parallel-arm resonator;
   an anti-resonant frequency of the first parallel-arm resonator is lower than an anti-resonant frequency of the second parallel-arm resonator; and
   the first parallel-arm resonator is defined by an acoustic wave resonator, the first parallel-arm resonator including:
      an IDT electrode that excites an acoustic wave; and
      a reflector that reflects the acoustic wave excited by the IDT electrode; wherein
      a pitch between the IDT electrode and the reflector is about $0.42\lambda$ or more and less than about $0.50\lambda$, where a wave length of an acoustic wave that is defined by an electrode period of the IDT electrode is denoted by $\lambda$.

2. The acoustic wave filter device according to claim 1, wherein in the first parallel-arm resonator, the pitch between the IDT electrode and the reflector is about $0.44\lambda$ or more and about $0.46\lambda$ or less.

3. The acoustic wave filter device according to claim 1, further comprising:
   an impedance circuit including an impedance element and a switch element connected in parallel; wherein
   at least one of the first parallel-arm resonator and the second parallel-arm resonator is connected in series with the impedance circuit.

4. The acoustic wave filter device according to claim 3, wherein
   the second parallel-arm resonator is connected in series with the impedance circuit; and
   the first parallel-arm resonator is connected in parallel to a circuit in which the second parallel-arm resonator and the impedance circuit are connected in series.

5. The acoustic wave filter device according to claim 3, wherein
   the first parallel-arm resonator is connected in series with the impedance circuit; and
   the second parallel-arm resonator is connected in parallel to a circuit in which the first parallel-arm resonator and the impedance circuit are connected in series.

6. The acoustic wave filter device according to claim 3, wherein the first parallel-arm resonator and the second parallel-arm resonator are connected in parallel; and the impedance circuit is connected in series with a circuit in which the first parallel-arm resonator and the second parallel-arm resonator are connected in parallel.

7. The acoustic wave filter device according to claim 1, further comprising:

two impedance circuits, each of the two impedance circuits including an impedance element and a switch element that are connected in parallel; wherein the first parallel-arm resonator is connected in series with one of the two impedance circuits;

the second parallel-arm resonator is connected in series with another of the two impedance circuits; and a circuit in which the first parallel-arm resonator and the one impedance circuit are connected in series and a circuit in which the second parallel-arm resonator and the other impedance circuit are connected in series are connected in parallel.

8. The acoustic wave filter device according to claim 1, further comprising:

a switch element connected in parallel to one of the first parallel-arm resonator and the second parallel-arm resonator; wherein another one of the first parallel-arm resonator and the second parallel-arm resonator is connected in series with a circuit in which the one parallel-arm resonator and the switch element are connected in parallel.

9. A radio-frequency front-end circuit comprising:

the acoustic wave filter device according to claim 1; and an amplifier circuit connected to the acoustic wave filter device.

10. The radio-frequency front-end circuit according to claim 9, wherein in the first parallel-arm resonator, the pitch between the IDT electrode and the reflector is about 0.44λ or more and about 0.46λ or less.

11. The radio-frequency front-end circuit according to claim 9, further comprising:

an impedance circuit including an impedance element and a switch element connected in parallel; wherein at least one of the first parallel-arm resonator and the second parallel-arm resonator is connected in series with the impedance circuit.

12. The radio-frequency front-end circuit according to claim 11, wherein the second parallel-arm resonator is connected in series with the impedance circuit; and the first parallel-arm resonator is connected in parallel to a circuit in which the second parallel-arm resonator and the impedance circuit are connected in series.

13. The radio-frequency front-end circuit according to claim 11, wherein the first parallel-arm resonator is connected in series with the impedance circuit; and the second parallel-arm resonator is connected in parallel to a circuit in which the first parallel-arm resonator and the impedance circuit are connected in series.

14. The radio-frequency front-end circuit according to claim 11, wherein the first parallel-arm resonator and the second parallel-arm resonator are connected in parallel; and the impedance circuit is connected in series with a circuit in which the first parallel-arm resonator and the second parallel-arm resonator are connected in parallel.

15. The radio-frequency front-end circuit according to claim 9, further comprising:

two impedance circuits, each of the two impedance circuits including an impedance element and a switch element that are connected in parallel; wherein the first parallel-arm resonator is connected in series with one of the two impedance circuits;

the second parallel-arm resonator is connected in series with another of the two impedance circuits; and a circuit in which the first parallel-arm resonator and the one impedance circuit are connected in series and a circuit in which the second parallel-arm resonator and the other impedance circuit are connected in series are connected in parallel.

16. The radio-frequency front-end circuit according to claim 9, further comprising:

a switch element connected in parallel to one of the first parallel-arm resonator and the second parallel-arm resonator; wherein another one of the first parallel-arm resonator and the second parallel-arm resonator is connected in series with a circuit in which the one parallel-arm resonator and the switch element are connected in parallel.

17. A communication apparatus comprising:

an RF signal processing circuit that processes a radio-frequency signal transmitted or received by an antenna element; and the radio-frequency front-end circuit according to claim 9 that transmits the radio-frequency signal between the antenna element and the RF signal processing circuit.

18. The communication apparatus according to claim 17, wherein in the first parallel-arm resonator, the pitch between the IDT electrode and the reflector is about 0.44λ, or more and about 0.46λ, or less.

19. The communication apparatus according to claim 17, further comprising:

an impedance circuit including an impedance element and a switch element connected in parallel; wherein at least one of the first parallel-arm resonator and the second parallel-arm resonator is connected in series with the impedance circuit.

20. The communication apparatus according to claim 19, wherein the second parallel-arm resonator is connected in series with the impedance circuit; and the first parallel-arm resonator is connected in parallel to a circuit in which the second parallel-arm resonator and the impedance circuit are connected in series.

* * * * *